(12) United States Patent
Miki

(10) Patent No.: US 7,388,769 B2
(45) Date of Patent: Jun. 17, 2008

(54) SEMICONDUCTOR MEMORY DEVICE

(75) Inventor: Takashi Miki, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/503,956

(22) Filed: Aug. 15, 2006

(65) Prior Publication Data

US 2007/0047286 A1    Mar. 1, 2007

(30) Foreign Application Priority Data

Aug. 19, 2005  (JP) ............................. 2005-239223

(51) Int. Cl.
*G11C 11/24* (2006.01)

(52) U.S. Cl. .................... 365/65; 365/145; 365/149

(58) Field of Classification Search .................. 365/65
See application file for complete search history.

(56) References Cited

U.S. PATENT DOCUMENTS 6,034,884 A * 3/2000 Jung ......................... 365/145
6,262,910 B1 * 7/2001 Takata et al. ................ 365/145
6,370,057 B1 * 4/2002 Akita ......................... 365/149
7,046,543 B2 * 5/2006 Arimoto et al. ............ 365/149
2005/0047191 A1 * 3/2005 Watanabe ................... 365/145
2007/0217249 A1 * 9/2007 Hirayama ................... 365/145

FOREIGN PATENT DOCUMENTS

JP          10-162587         6/1998
JP          10-162589         6/1998

* cited by examiner

*Primary Examiner*—Tan T. Nguyen
(74) *Attorney, Agent, or Firm*—Wenderoth, Lind & Ponack, L.L.P.

(57) ABSTRACT

A semiconductor memory device includes plural memory cells MC arranged in a matrix, plural bit lines BL and plural plate line voltage supply lines SCP which are arranged in a row direction, plural sense amplifier circuits SA which are arranged in a column direction and are electrically connected to the respective bit lines, plural plate line voltage supply circuits CPD which are arranged in the column direction and drive the plate line voltage supply lines SCP, and means for electrically connecting the plate line voltage supply lines SCP with the plural plate lines CP, wherein the respective plate voltage supply lines SCP are electrically connected, at different positions on the same plate line CP, to the plate line CP.

21 Claims, 41 Drawing Sheets

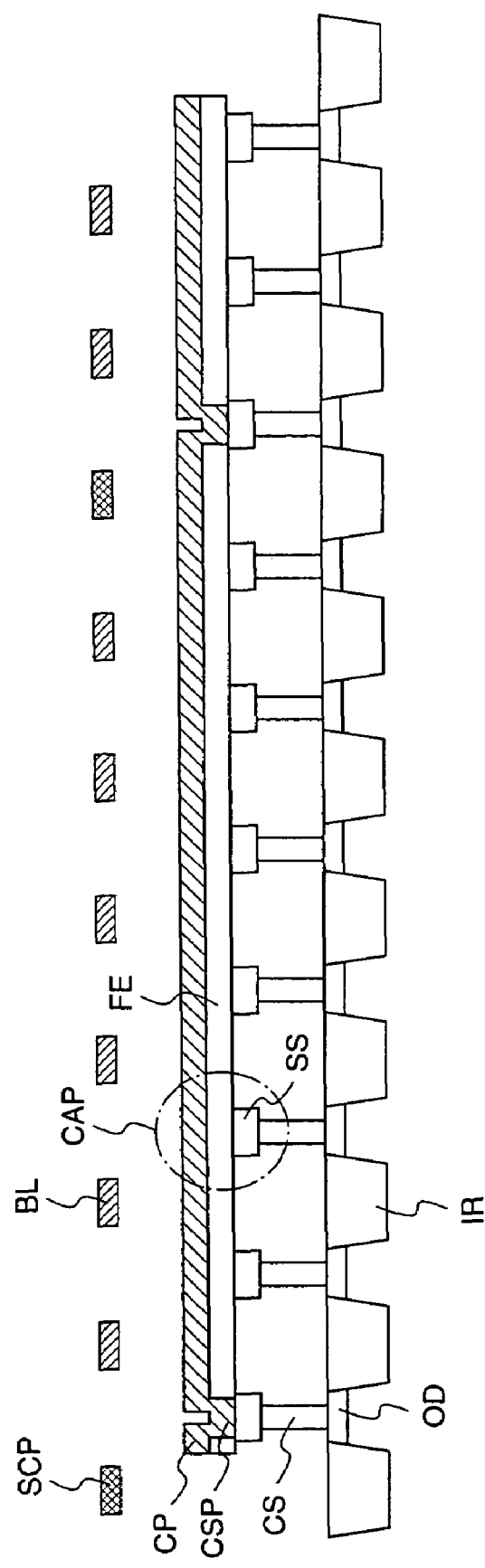

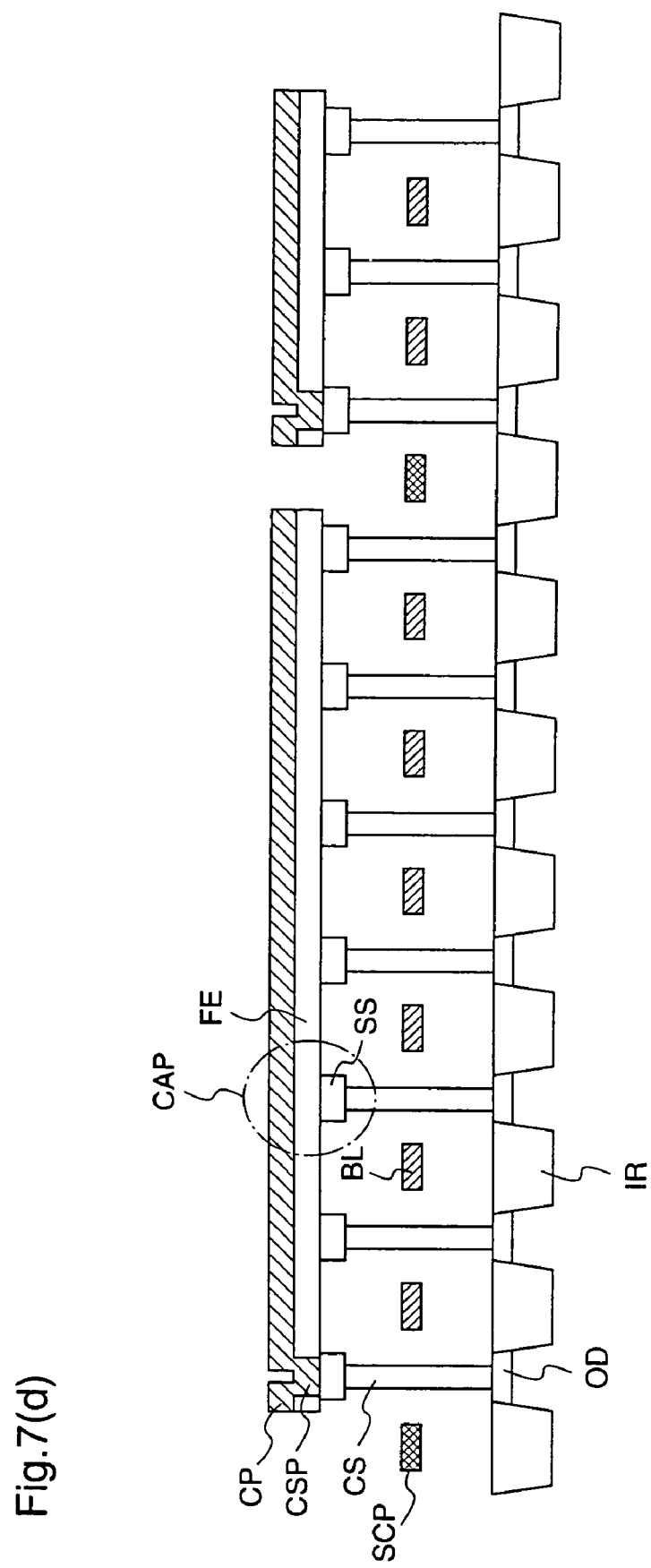

SEMICONDUCTOR MEMORY DEVICE

FIELD OF THE INVENTION

The present invention relates to a semiconductor memory device and, more particularly, to a technique that is effective when applied to a semiconductor memory device with a ferroelectric substance.

BACKGROUND OF THE INVENTION

Recently, there has been known a semiconductor memory device which uses a ferroelectric film as an insulating film for capacitors to make data storage nonvolatile.

Transition of the polarized state of a ferroelectric substance shows hysteresis characteristics, and remnant polarization exists in the ferroelectric substance even when a voltage applied to the ferroelectric substance becomes 0, and therefore, nonvolatile data storage is carried out utilizing the remnant polarization.

In order to read the nonvolatile data from the ferroelectric capacitors, it is necessary to apply voltage to the ferroelectric capacitors, and generally, reading is carried out by driving plate lines that constitute electrodes of the ferroelectric capacitors.

While the plate lines drive plural memory cells that are arranged in a word line direction, the capacitances of the ferroelectric capacitors that are driven by the plate lines are significantly larger than those of capacitors that are formed of a silicon oxide film, which are usually adopted in a dynamic semiconductor memory device, and therefore, load capacitances connected to the plate lines are excessively large. Further, since Ir or IrO is used as a material of the plate lines, the resistance of the plate lines is high.

The excessive load capacitances connected to the plate lines and the high resistance of the plate lines cause a problem that the access time of the memory device is significantly increased.

On the other hand, in order to drive the plate lines at an appropriate speed, MOS transistors of high driving abilities must be used, leading to increased power consumption and increased layout area.

So, as a method for resolving the excessive load capacitances of the plate lines and the increase in the layout area, there have been proposed circuit systems such as a plate line division system and a plate line voltage fixation system, and circuit operations.

Hereinafter, a description will be given of a conventional semiconductor memory device with a ferroelectric substance.

Initially, as for a first conventional system, assuming that the above-mentioned problems cannot be solved by the plate line driving system, there is disclosed a semiconductor circuit that is operated with voltage of plate lines being fixed, without driving the plate lines (for example, refer to Japanese Published Patent Application No. Hei.10-162587 (Patent Document 1)). According to this system, since the plate lines are not driven, the plate line driving time is omitted to prevent increase in the access time.

Further, as for a plate line division system that is a second conventional system, there is disclosed a semiconductor circuit in which plural plate lines are provided for one word line (for example, refer to Japanese Published Patent Application No. Hei.10-162589 (Patent Document 2)). According to this system, since plural plate lines are provided for one word line, only desired memory cells can be operated, thereby preventing increase in the load capacitances connected to the plate lines to prevent increase in the access time.

However, the above-mentioned conventional techniques may have the following drawbacks. Since a layout is not particularly designated in either Patent Document 1 or Patent Document 2, a generally conceivable layout is presumed.

Initially, in the system disclosed in Patent Document 1, usually a layout as shown in FIG. 11 is considered. Hereinafter, this layout will be described with reference to FIG. 11.

FIG. 11 is a plan view for explaining a semiconductor memory device according to the first conventional system. In the semiconductor memory device, there are disposed plural word lines WL extending in a column direction DWL, plural bit lines BL extending in a row direction DBL, one plate line CP as large as a memory array MA, sense amplifier circuits SA that are adjacent to the memory array MA in the row direction DBL of the memory array MA, and plate line voltage supply circuits CPD that are adjacent to the memory array MA in the column direction DWL of the memory array MA. The bit lines BL are connected to the sense amplifier circuits SA, and the plate line CP is connected to the plate line voltage supply circuits CPD.

This circuit system employs the operation mode with the voltage of the plate line CP being fixed, and usually, supply of voltage tote plate line is carried out at an end of the memory cell array MA. However, it has become obvious from an analysis by the inventors of the present invention that the following problem occurs when voltage is supplied to the plate line at only the periphery of the memory cell array. That is, when a specific memory cell is operated, since the resistance of the plate line is high in a non-operating memory cell disposed in the vicinity of the operating memory cell, the voltage of the plate line is likely to cause undershoot or overshoot temporarily and locally, leading to degradation in data holding of the memory cell.

For example, when a memory cell Pos1 shown in FIG. 11 is operated, the plate line voltage in the vicinity of the Pos1 varies, whereby the plate line voltage in the vicinity of the non-operating Pos2, which voltage is supplied from the periphery of the memory cell array, causes undersupply of voltage because the resistance of the plate line is high, and the plate line voltage in the vicinity of the Pos2 also varies with the variation in the plate line voltage in the vicinity of the Pos1, leading to simple writing operation of the memory cell in the vicinity of the Pos2, resulting in degradation of data holding of the memory cell.

Further, in order so solve the above-mentioned problem, when miniaturization of the memory cell array is considered, more plate line voltage generation circuits CPD must be provided, leading to increase in the area of the semiconductor memory device.

Especially, in the system disclosed in Patent Document 2, a layout as shown in FIG. 12 is usually considered.

Hereinafter, the layout will be described with reference to FIG. 12.

FIG. 12 is a plan view for explaining a semiconductor memory device according to the second conventional system. In the semiconductor memory device, there are disposed plate lines CP and word lines WL extending in the column direction DWL (two plate lines CP are disposed for one word line WL), bit lines BL extending in the row direction DBL, sense amplifier circuits SA that are adjacent to the memory array MA in the row direction DBL of the memory array MA, and plate line voltage supply circuits CPD that are adjacent to the memory array MA in the column direction DWL of the memory array MA. The bit lines BL are connected to the sense amplifier circuits SA, and the plate lines CP are connected to the plate line voltage supply circuits CPD.

In this system, when miniaturization and high-density integration of the semiconductor memory device with a ferroelectric substance are proceeded, the load capacitance and resistance of the plate lines CP reach non-negligible levels, resulting in obstacles in promoting further speed-up.

Further, in order to solve the above-mentioned problem, when increase in the capability of driving the plate lines CP is considered, transistors of large driving capabilities must be used for the plate line voltage generation circuits CPD, leading to increase in the area of the plate line voltage generation circuits CPD.

Further, when further division of the plate lines CP is considered to solve the above-mentioned problem, more plate line voltage generation circuits CPD must be provided, leading to increase in the area of the ferroelectric substance memory device.

SUMMARY OF THE INVENTION

The present invention is made to solve the above-described problems and has for its object to provide a semiconductor memory device with a ferroelectric substance, which can perform high-speed operation, small in scale, and low in power consumption, by contriving a layout of voltage supply to plate lines.

Other objects and advantages of the invention will become apparent from the detailed description that follows. The detailed description and specific embodiments described are provided only for illustration since various additions and modifications within the scope of the invention will be apparent to those of skill in the art from the detailed description.

In order to solve the above-mentioned problems, according to the present invention, there is provided a semiconductor memory device in which one or plural plate voltage supply lines for supplying a voltage to plate lines that are disposed in the same direction as word lines are disposed in the same direction as bit lines.

A semiconductor memory device according to the present invention comprises plural memory cells arranged in a matrix; plural bit lines and plural plate voltage supply lines extending in a row direction; plural word lines and plural plate lines extending in a column direction; plural sense amplifier circuits that are arranged in the column direction, and are electrically connected to the respective bit lines; plural plate line voltage supply circuits that are arranged in the column direction; means for electrically connecting each of the plural plate voltage supply lines with each of the plural plate lines; and means for electrically connecting each of the plural plate voltage supply lines with each of the plural plate line voltage supply circuits; wherein each of the plural bit lines is commonly connected to the plural memory cells arranged in the same row; each of the plural word lines and each of the plural plate lines are commonly connected to the plural memory cells arranged in the same column; each of the plural memory cells is electrically connected to the bit line through a selection transistor having a gate electrode connected to the word line, and has a capacitor electrically connected to the plate line; and the respective plate voltage supply lines are electrically connected to the plate lines at different positions on the same plate line.

According to the present invention, it is possible to supply voltage of one plate line from plural plate line voltage supply lines, whereby delay in plate line driving can be prevented, resulting in stabilized plate line voltage, and speed-up in plate line driving. Further, each plate line voltage supply circuit can be reduced in dimension.

Further, since at least one plate line voltage supply circuit is needed for plural plate lines extending in the column direction, the plate line voltage supply circuit can be reduced in dimension.

Further, since no plate line voltage supply circuit is disposed between adjacent memory cell lines among plural memory cell lines arranged in the column direction, periodicity of the memory cell arrangement can be enhanced, whereby shape stability in formation of memory cell shapes is increased, leading to reduction in variations of memory cell characteristics.

In the semiconductor memory device according to the present invention, the capacitor is a ferroelectric capacitor or a high dielectric capacitor.

Further, in the semiconductor memory device according to the present invention, the plate voltage supply lines are formed of the same layer as the bit lines.

According to this construction, since the plate voltage supply lines are fabricated without using an additional wiring layer, the plate voltage supply lines can be easily fabricated without including process steps.

Further, according to this construction, since the plate voltage supply line can use the resistive characteristic and load capacitance of the bit line that is capable of high-speed operation, the plate voltage supply line can be operated at a higher speed than that of the bit line by using a wiring equal to or wider than the bit line, leading to speed-up in driving the plate lines, and consequently, high-speed operation of the ferroelectric memory device can be achieved.

Further, in the semiconductor memory device according to the present invention, the plate voltage supply lines are formed of a layer different from that of the bit lines.

According to this construction, the width of each plate voltage supply line can be increased as compared with the case where the plate voltage supply lines are formed of the same layer as the bit lines, and therefore, the operation of the memory device can be speeded up.

Further, in the semiconductor memory device according to the present invention, the respective plate voltage supply lines are approximately equal in shape to the respective bit lines, or an interval between adjacent plate voltage supply line and bit line is approximately equal to an interval between adjacent two bit lines.

According to this construction, since the plate voltage supply lines and the bit lines are periodically disposed, integration can be enhanced, whereby the ferroelectric memory device can be reduced in dimension. Further, shape stability and flatness can be enhanced, leading to reductions in variations: in resistive characteristic and load capacitance of the plate voltage supply lines and the bit lines.

Further, in the semiconductor memory device according to the present invention, the respective plate voltage supply lines are different in shape from the respective bit lines.

According to this construction, the width of the plate voltage supply line can be made larger than the width of the bit line, whereby the operation of the memory device can be speeded up.

Further, in the semiconductor memory device according to the present invention, the plural memory cells are divided into at least two memory cell groups in the column direction, and plural memory cells that are arranged in the same column and belong to different memory cell groups are respectively connected to different plate lines.

According to this construction, since the plate line corresponding to one word line is divided, the load capacitance of each of the divided plate lines can be reduced. Therefore, the plate line voltage can be stabilized, and driving of the plate lines can be speeded up, and moreover, the respective plate line voltage supply circuits can be further reduced in dimensions.

Further, in the semiconductor memory device according to the present invention, each of the plural plate line voltage supply circuits is selectively operated by means that selectively electrically connecting the plate line voltage supply circuit with each of the plate voltage supply lines.

According to this construction, since each of the plural plate line voltage supply circuits can be selectively operated, reduced power consumption can be achieved.

Further, in the semiconductor memory device according to the present invention, the means for electrically connecting each of the plural plate voltage supply lines with each of the plural plate lines is a selection circuit.

According to this construction, since a desired number of plate lines among the plural plate lines can be selectively driven by one plate voltage supply line, reduced scale and reduced power consumption can be achieved.

Further, in the semiconductor memory device according to the present invention, the means for electrically connecting each of the plural plate voltage supply lines with each of the plural plate lines is a selection circuit including at least one transistor.

According to this construction, since a desired number of plate lines among the plural plate lines can be selectively driven by one plate voltage supply line, reduced scale and reduced power consumption can be achieved.

Further, in the semiconductor memory device according to the present invention, at least one of the transistors included in the selection circuit has a gate connected to the word line.

According to this construction, since the plate lines can be driven synchronously with the word lines, the circuit structure and operation mode of the semiconductor memory device can be simplified. Further, since the word lines and the gates of the transistors can be constituted by a common wiring, the memory cells can be further reduced in dimensions.

Further, in the semiconductor memory device according to the present invention, at least one of the transistors included in the selection circuit has a gate connected to the plate line driving signal line.

According to this construction, since the plate lines can be driven asynchronously with the word lines, the voltage of the plate line voltage supply lines can be fixed, thereby realizing speed-up of the circuit. Further, since the voltage of the plate line voltage supply lines is fixed, it is not necessary to drive the plate line voltage supply lines, and therefore, the circuit scale of the plate line voltage supply circuit can be reduced, and further, the power consumption of the plate line voltage supply circuit can be reduced, and moreover, the plate line voltage supply circuit can be reduced in dimension.

Further, in the semiconductor memory device according to the present invention, the plate line voltage supply circuit is disposed between two of the plural sense amplifier circuits arranged in the column-direction.

According to this construction, since the sense amplifier circuits and the plate line voltage supply circuits are arranged in the same column direction, periodicity of the circuit arrangement can be enhanced, whereby shape stability is increased in forming the shape of the circuit pattern, leading to reductions in variations in the characteristics of the sense amplifier circuits and the plate line voltage supply circuits.

Further, in the semiconductor memory device according to the present invention, the means that electrically connects each of the plate voltage supply lines with each of the plate lines is a conductive material, and the plate voltage supply line and the plate line are directly electrically connected.

According to this construction, the operation mode with the voltage of the plate lines being fixed can be easily obtained. Particularly in the conventional device, since supply of voltage to the plate lines is carried out at only the periphery of the memory cell array, the resistance of the plate line is high in the memory cell that is disposed in the vicinity of the memory cell being operated, and therefore, the voltage of the plate line is likely to occur local undershoot or overshoot, leading to degradation in data holding of the memory cell. However, in the construction of the present invention, since voltage can be supplied to the plate lines at plural portions in the row direction as well as the column direction, the voltage of the plate lines can be further stabilized.

Further, in the semiconductor memory device according to the present invention, the respective plate line voltage supply circuits are power supply wirings.

According to this construction, since the circuit structure for supplying voltage to the plate lines is simple and small in dimension, design of the semiconductor memory device is facilitated. Further, the capability of supplying voltage to the plate lines becomes sufficient.

A semiconductor memory device according to the present invention comprises plural memory cells; a bit line and a plate voltage supply line extending in a row direction; a word line and a plate line extending in a column direction; a sense amplifier circuit electrically connected to the bit line; and a plate line voltage supply circuit for supplying a plate line voltage to the plate voltage supply line; wherein the plural memory cells are arranged in at least one of the row direction and the column direction; data in the memory cells arranged in the same row are accessed by the same bit line; the memory cells arranged in the same column are selected by the same word line, and are supplied with the plate line voltage through the same plate line; and the plate voltage supply line and the plate line are electrically connected at an intersection point thereof.

According to this construction, by supplying plate voltage from plural plate voltage supply lines to one plate line, speed-up in driving the plate line can be achieved. Further, when only one plate line voltage supply circuit is provided, the area occupied by the plate line voltage supply circuit can be reduced.

Further, in the semiconductor memory device according to the present invention, the means for electrically connecting the plate voltage supply line with the plural plate lines is a conductive member, and the plate voltage supply line and the plural plate lines are directly electrically connected.

According to this construction, the operation mode with the voltage of the plate lines being fixed can be easily obtained.

Further, in the semiconductor memory device according to the present invention, the plate line voltage supply circuit is a power supply wiring.

According to this construction, since the circuit structure for supplying voltage to the plate lines is simple and small in dimension, design of the semiconductor memory device is facilitated. Further, the capability of supplying voltage to the plate lines becomes sufficient.

Further, in the semiconductor memory device according to the present invention, the plural memory cells are arranged in only one line in the column direction; plural bit lines and plural plate voltage supply lines extending in the row direction are disposed; plural sense amplifier circuits are disposed in the column direction, and each sense amplifier circuit is electrically connected to the corresponding bit line; plural plate line voltage supply circuits are disposed in the column direction, and each plate line voltage supply circuit is electrically connected to the corresponding plate voltage supply line; the word line and said plate line extending in the column direction are commonly connected to the plural memory cells arranged in one column; each of the plural memory cells is electrically connected to the bit line through a selection transistor having a gate electrode connected to the word line, and has a ferroelectric capacitor electrically connected to the plate line; and the plural plate voltage supply lines are electrically connected to the plate line in at least one position on the same plate line.

According to this construction, plate voltage can be supplied from plural plate voltage supply lines to one plate line, whereby speed-up in driving the plate line can be achieved.

Further, in the semiconductor memory device according to the present invention, the plural memory cells are arranged only in one line in the row direction; plural word lines and plural plate lines extending in the column direction are disposed; one sense amplifier circuit is disposed for the plural memory cells, and is electrically connected to the bit line; one plate line voltage supply circuit is disposed for the plural memory cells, and is electrically connected to the plate voltage supply line; the bit line and said plate voltage supply line extending in the row direction are commonly connected to the plural memory cells arranged in one column; each of the plural memory cells is electrically connected to the bit line through a selection transistor having a gate electrode connected to the word line, and has a ferroelectric capacitor electrically connected to the plate line; and the plate voltage supply line connected to the one plate line voltage supply circuit is electrically connected to the plural plate lines.

According to this construction, plate voltage can be supplied from one plate voltage supply line to plural plate lines. Therefore, it is not necessary to provide a plate line voltage supply circuit for each of the plural plate lines, whereby the area occupied by the plate line voltage supply circuit can be reduced.

EFFECT OF THE INVENTION

As described above, according to the present invention, plate voltage supply lines for supplying voltage to plate lines that are arranged in the same direction as word lines are arranged in the same direction as bit lines, thereby realizing a semiconductor memory device that can achieve speed-up in driving the plate lines, and high integration of plate line voltage supply circuits.

BRIEF DESCRIPTION OF THE DRAWINGS

FIG. 5(d) is a cross-sectional view taken along a line B1-B1' in FIG. 5(a).

FIG. 7(d) is a cross-sectional view taken along a line B1-B1' in FIG. 7(a).

DETAILED DESCRIPTION OF THE PREFERRED EMBODIMENTS

Embodiment 1

Figure 1:
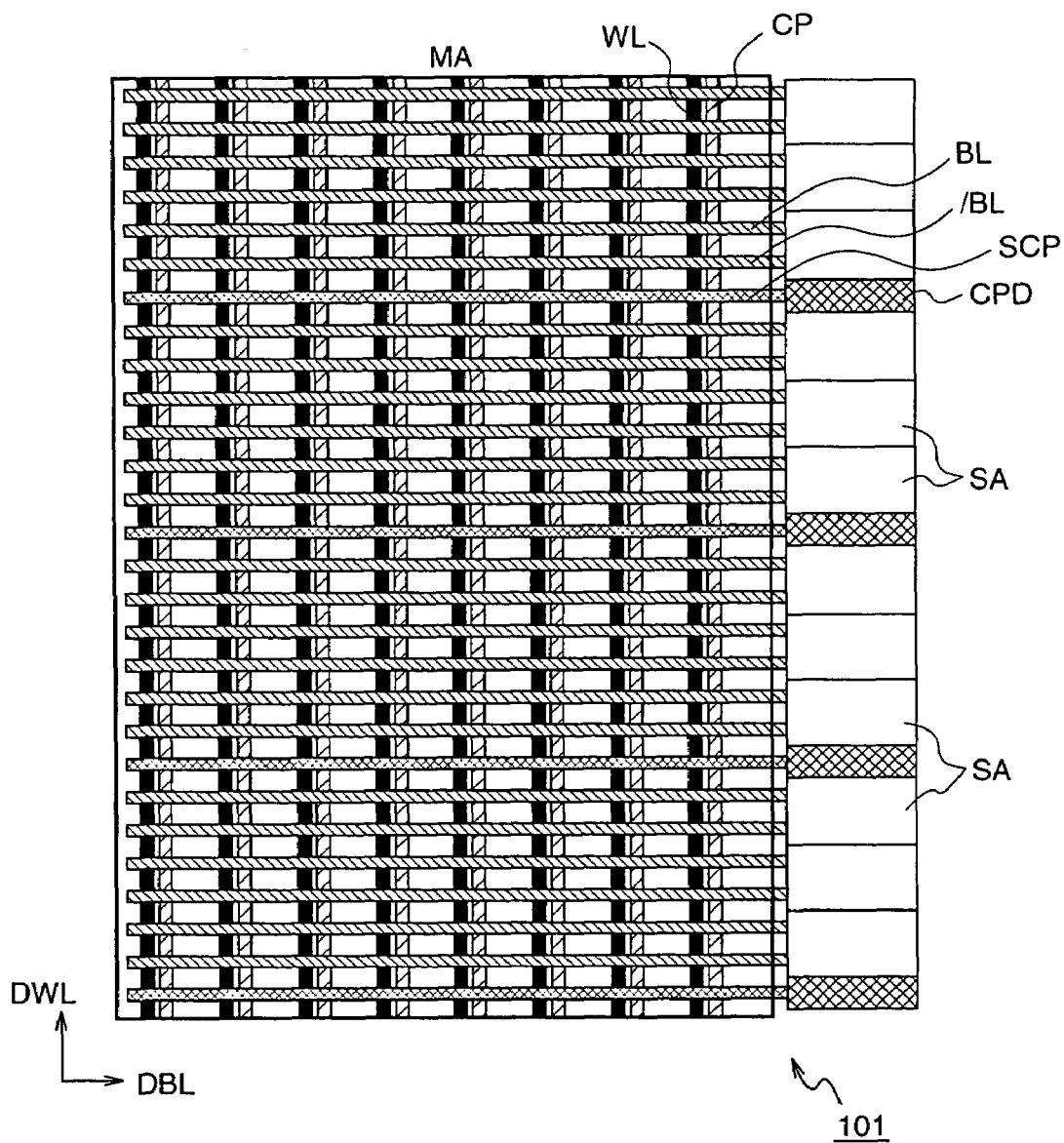
FIG. 1 is a plan view for explaining a semiconductor memory device according to a first embodiment of the present invention.

FIG. 1 is a first plan view for conceptually illustrating a semiconductor memory device according to a first embodiment of the present invention.

Figure 5A:
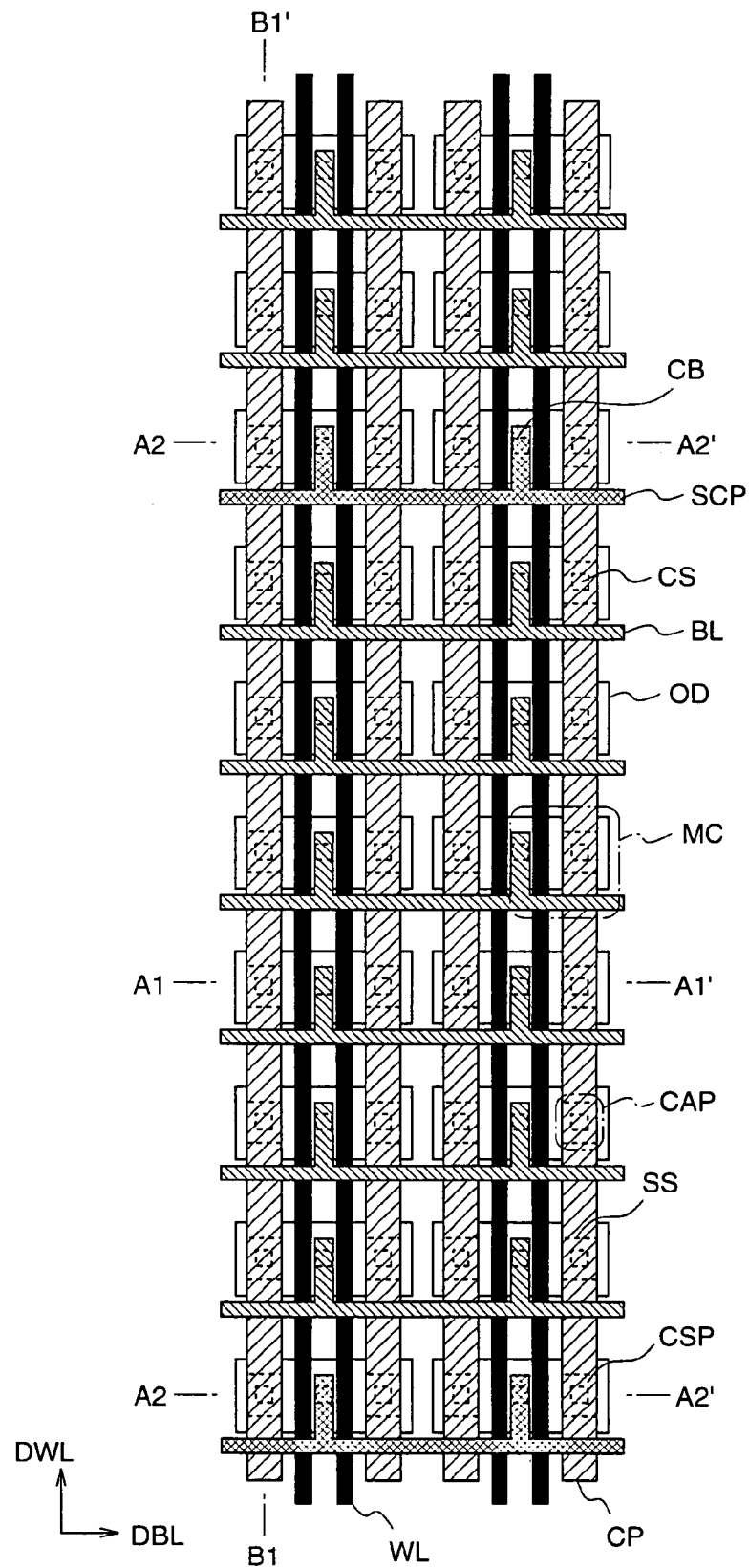
FIG. 5(a) is a plan view illustrating a memory cell array in the semiconductor memory device according to the first embodiment.
Figure 5B:
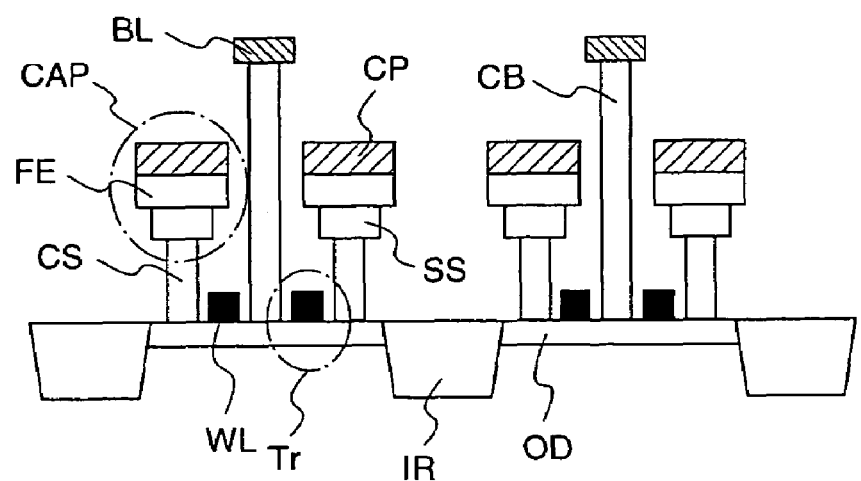
FIG. 5(b) is a cross-sectional view taken along a line A1-A1' in FIG. 5(a).
Figure 5C:
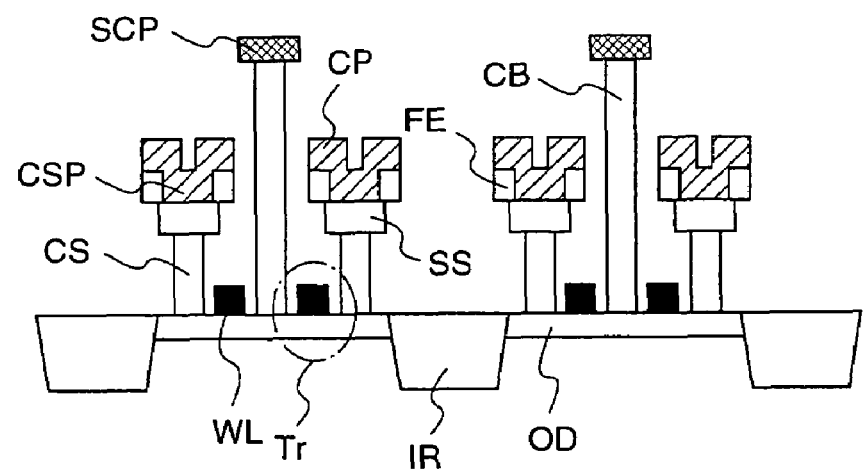
FIG. 5(c) is a cross-sectional view taken along a line A2-A2' in FIG. 5(a).
Figure 5E:
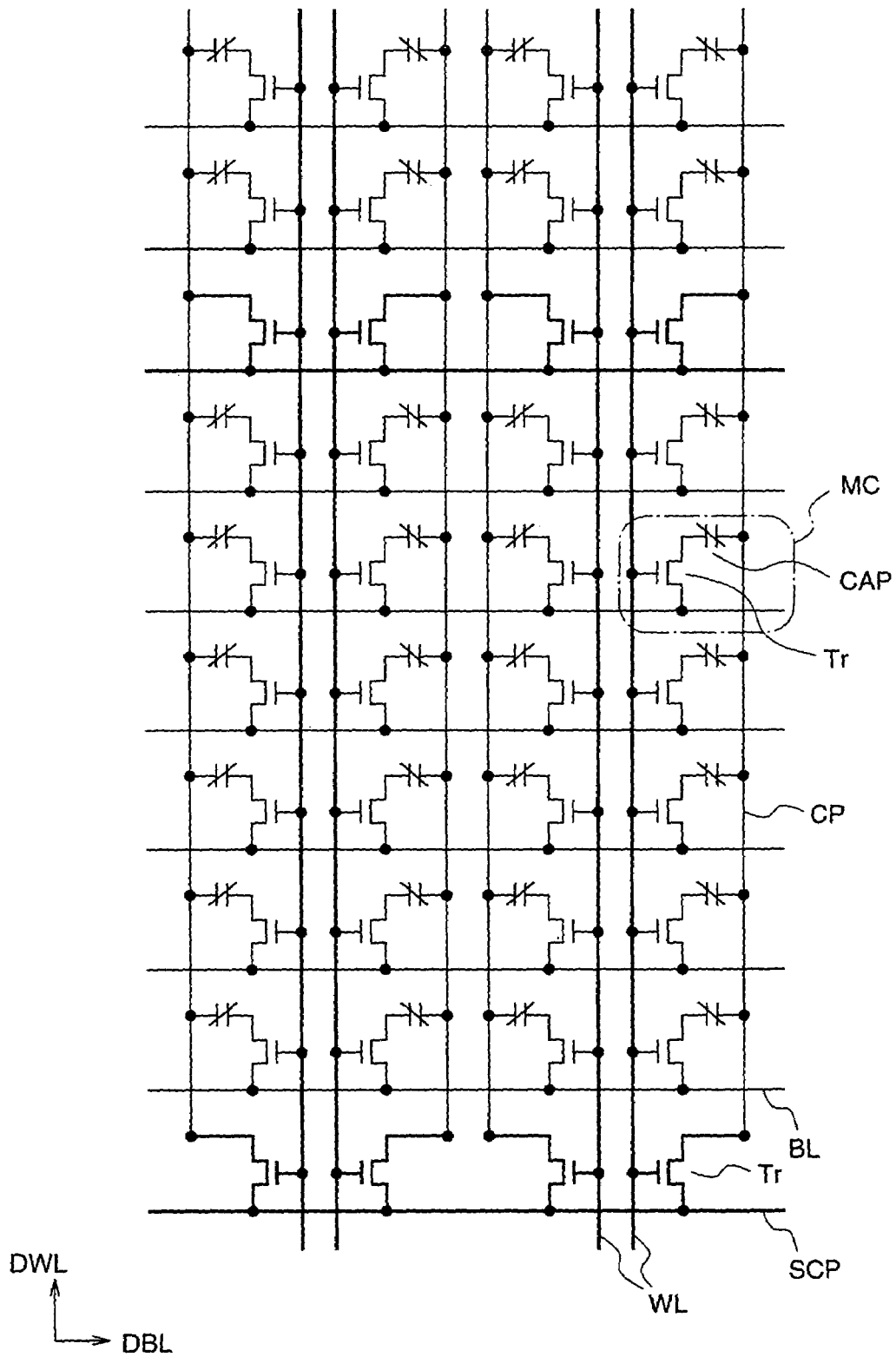
FIG. 5(e) is a circuit schematic view of the memory cell array shown in FIG. 5(a).
Figure 6A:
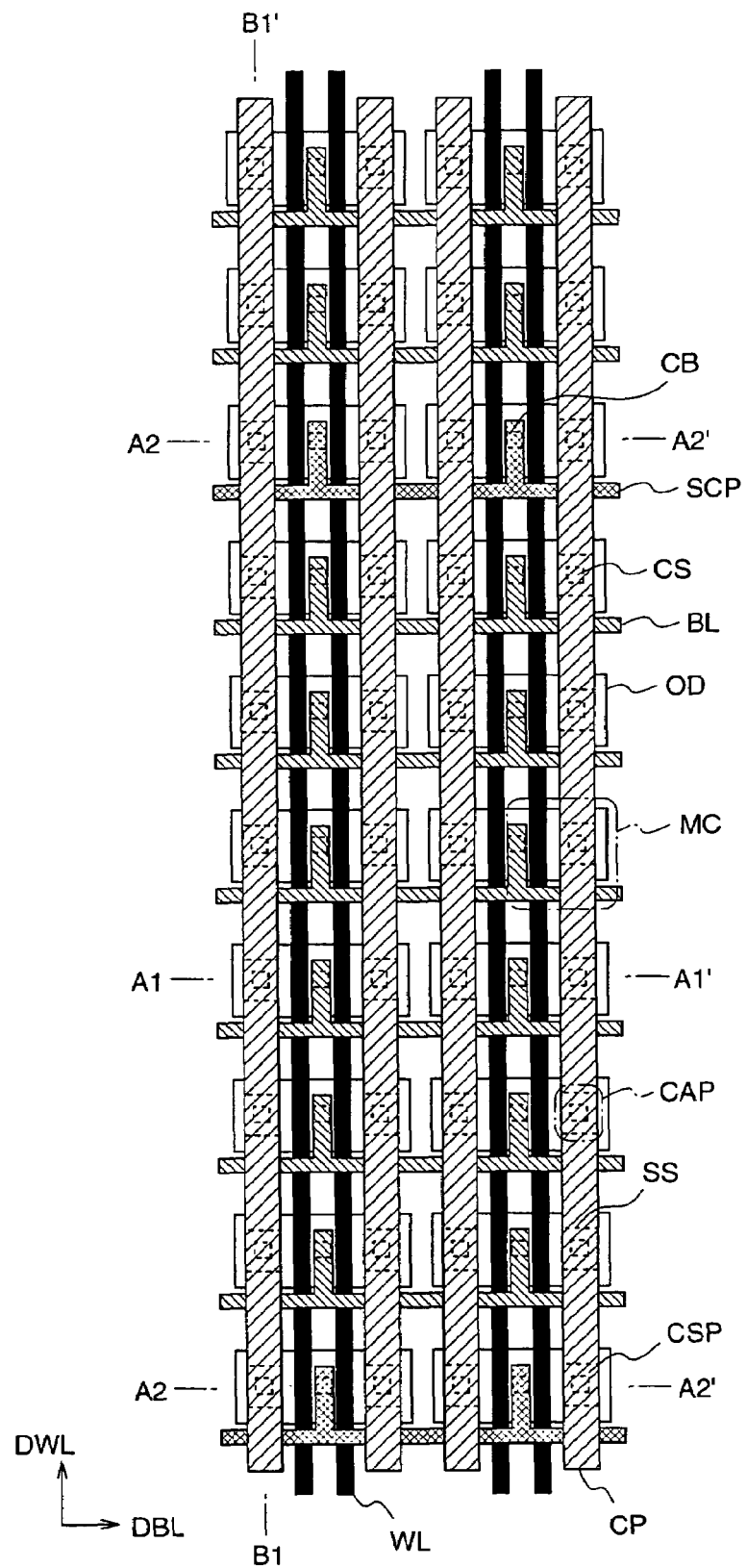
FIG. 6(a) is a plan view illustrating a memory cell array in the semiconductor memory device according to the second embodiment.
Figure 6B:
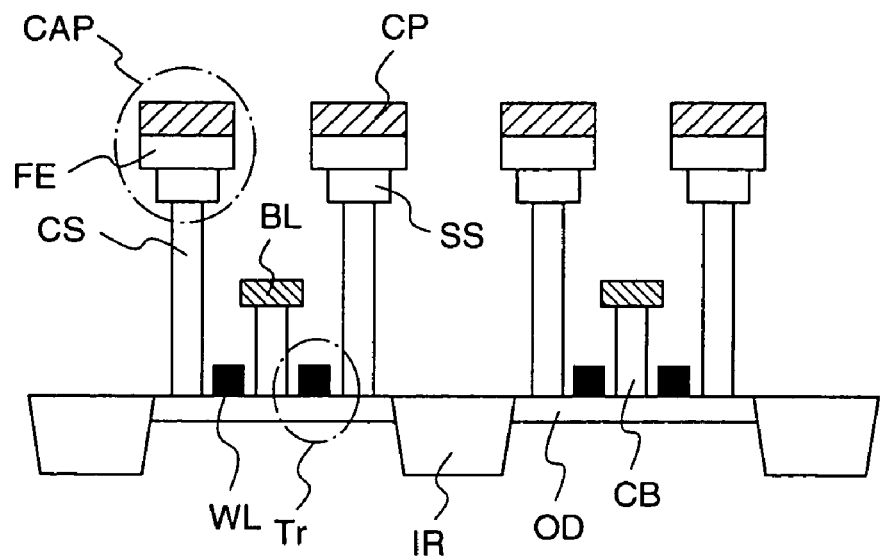
FIG. 6(b) is a cross-sectional view taken along a line A1-A1' in FIG. 6(a).
Figure 6C:
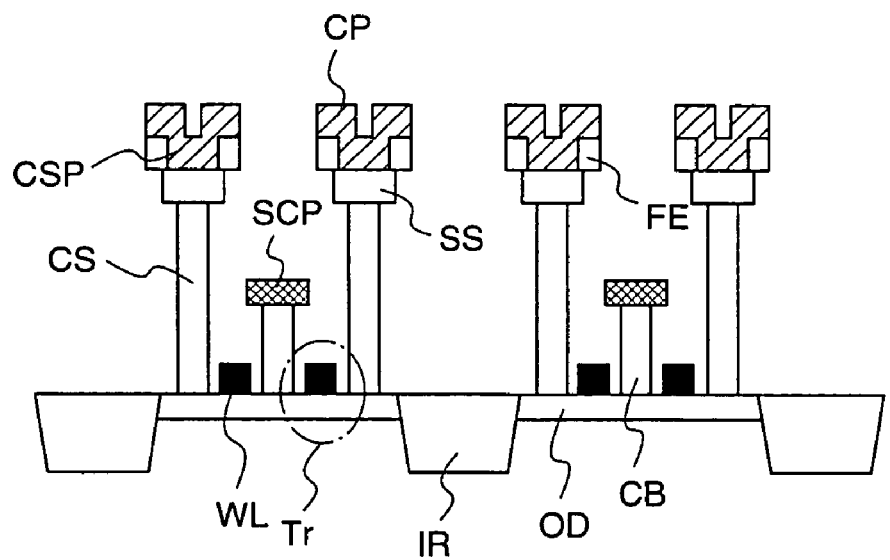
FIG. 6(c) is a cross-sectional view taken along a line A2-A2' in FIG. 6(a).
Figure 6D:
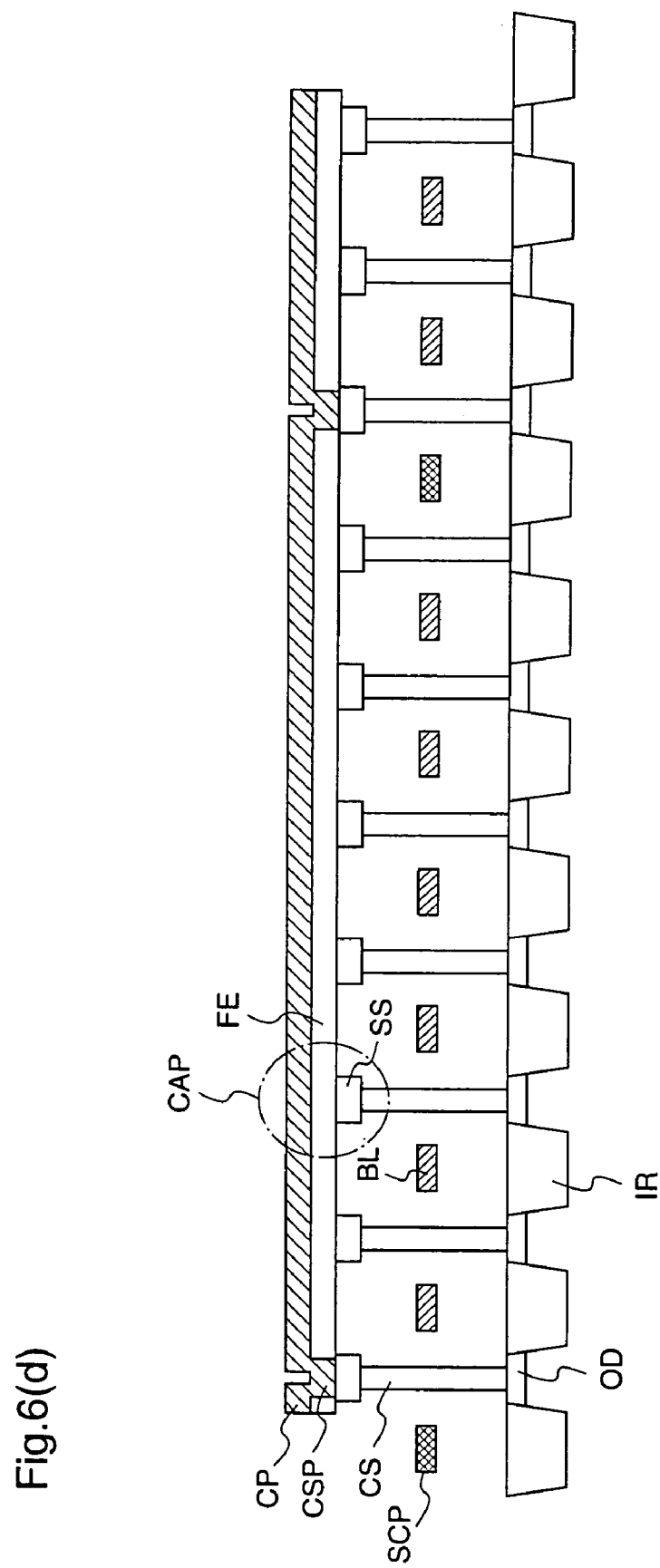
FIG. 6(d) is a cross-sectional view taken along a line B1-B1' in FIG. 6(a).
Figure 6E:
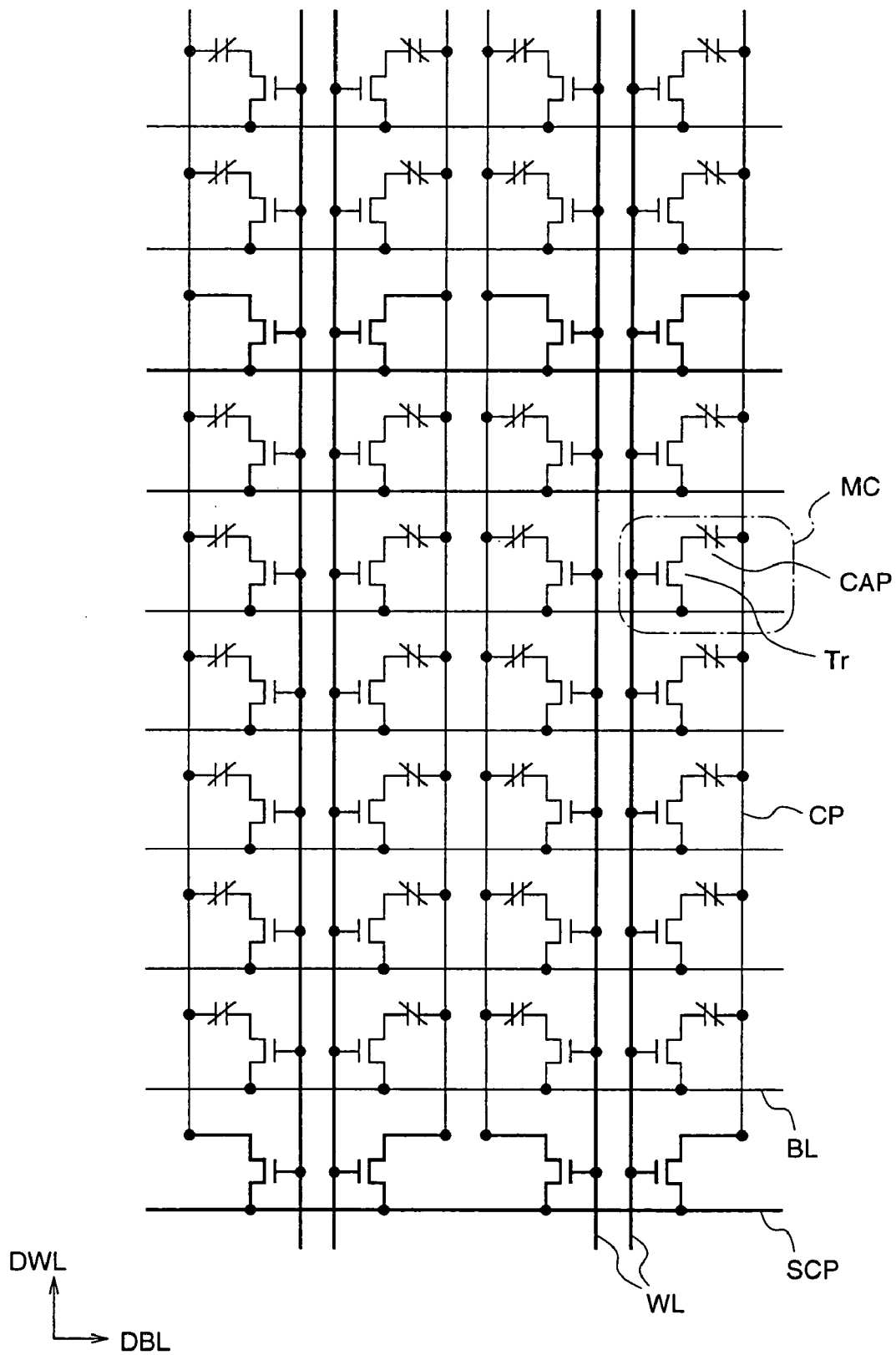
FIG. 6(e) is a circuit schematic view of the memory cell array shown in FIG. 6(a).
Figure 7A:
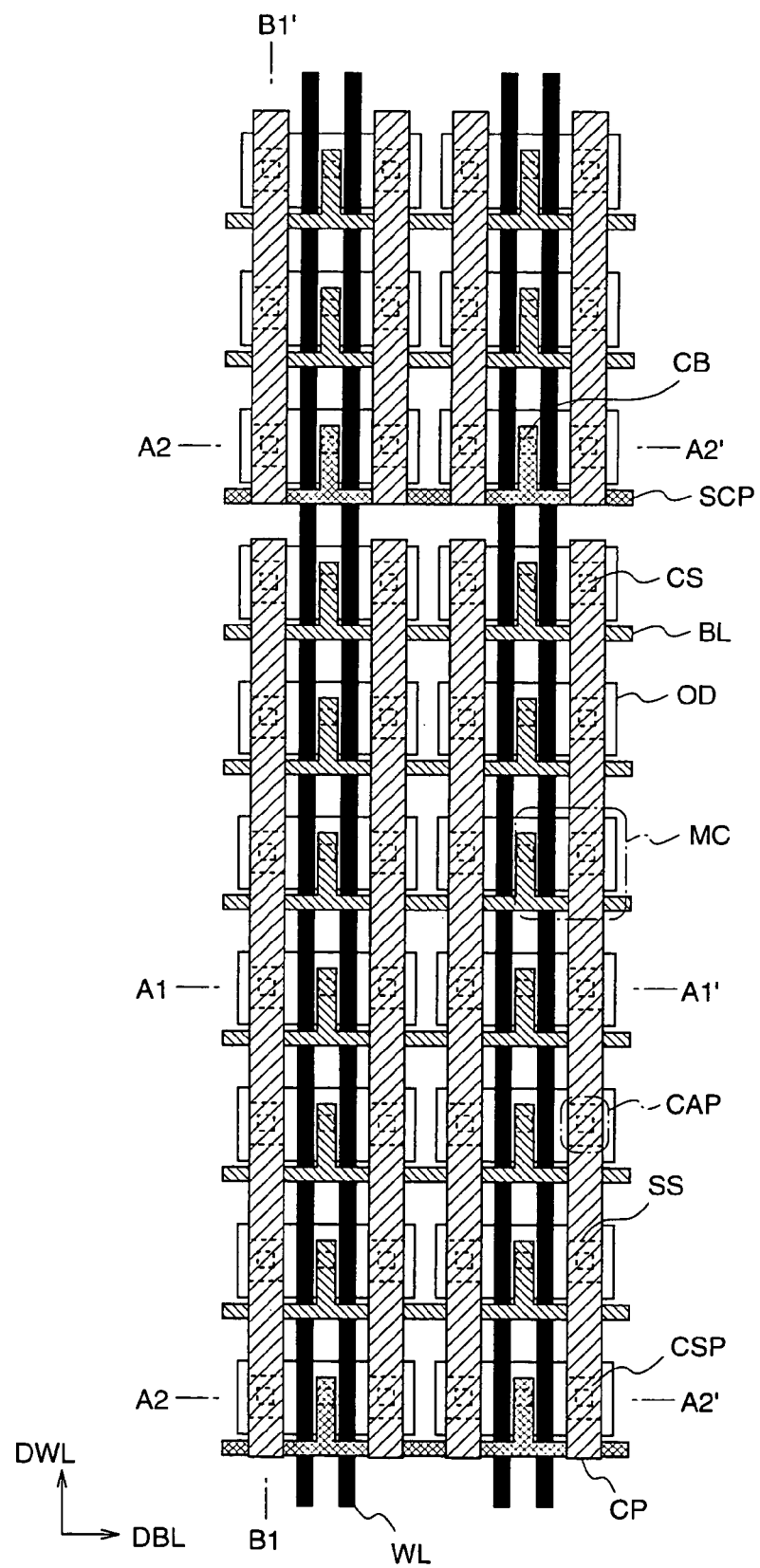
FIG. 7(a) is a plan view illustrating a memory cell array in the semiconductor memory device according to the third embodiment.
Figure 7B:
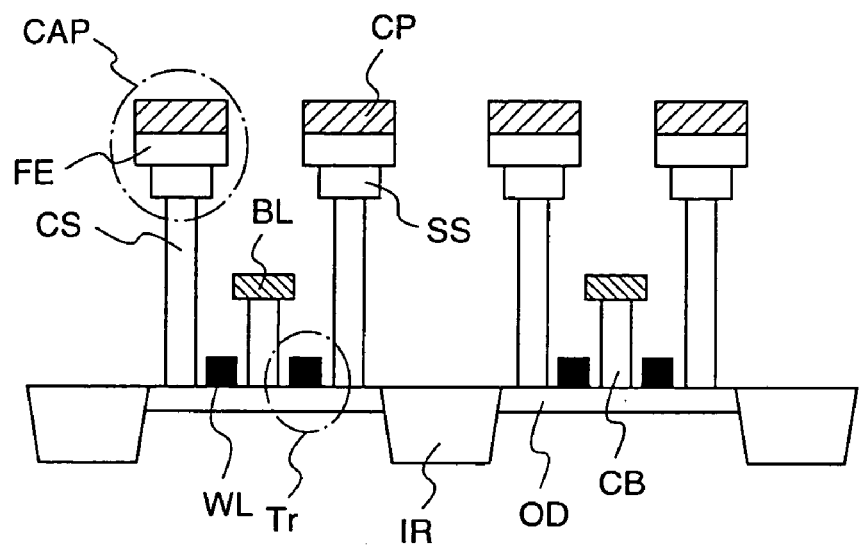
FIG. 7(b) is a cross-sectional view taken along a line A1-A1' in FIG. 7(a).
Figure 7C:
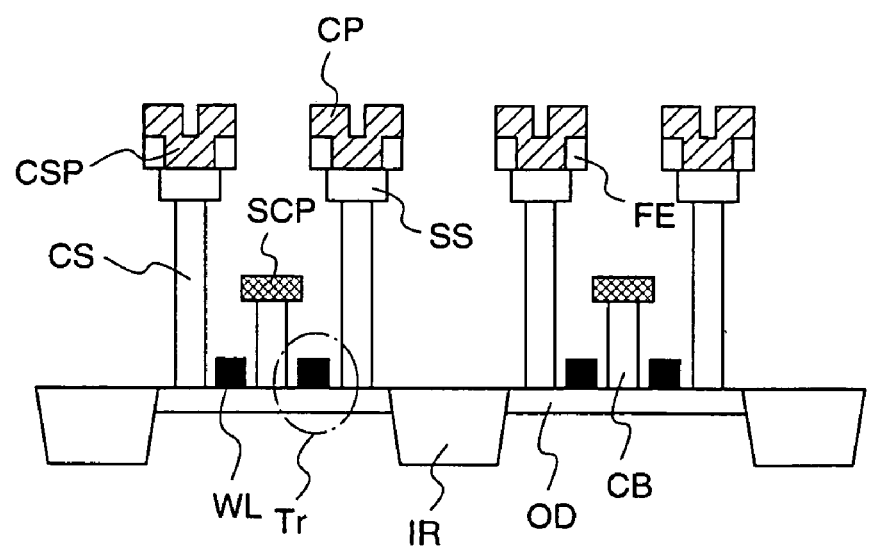
FIG. 7(c) is a cross-sectional view taken along a line A2-A2' in FIG. 7(a).
Figure 7E:
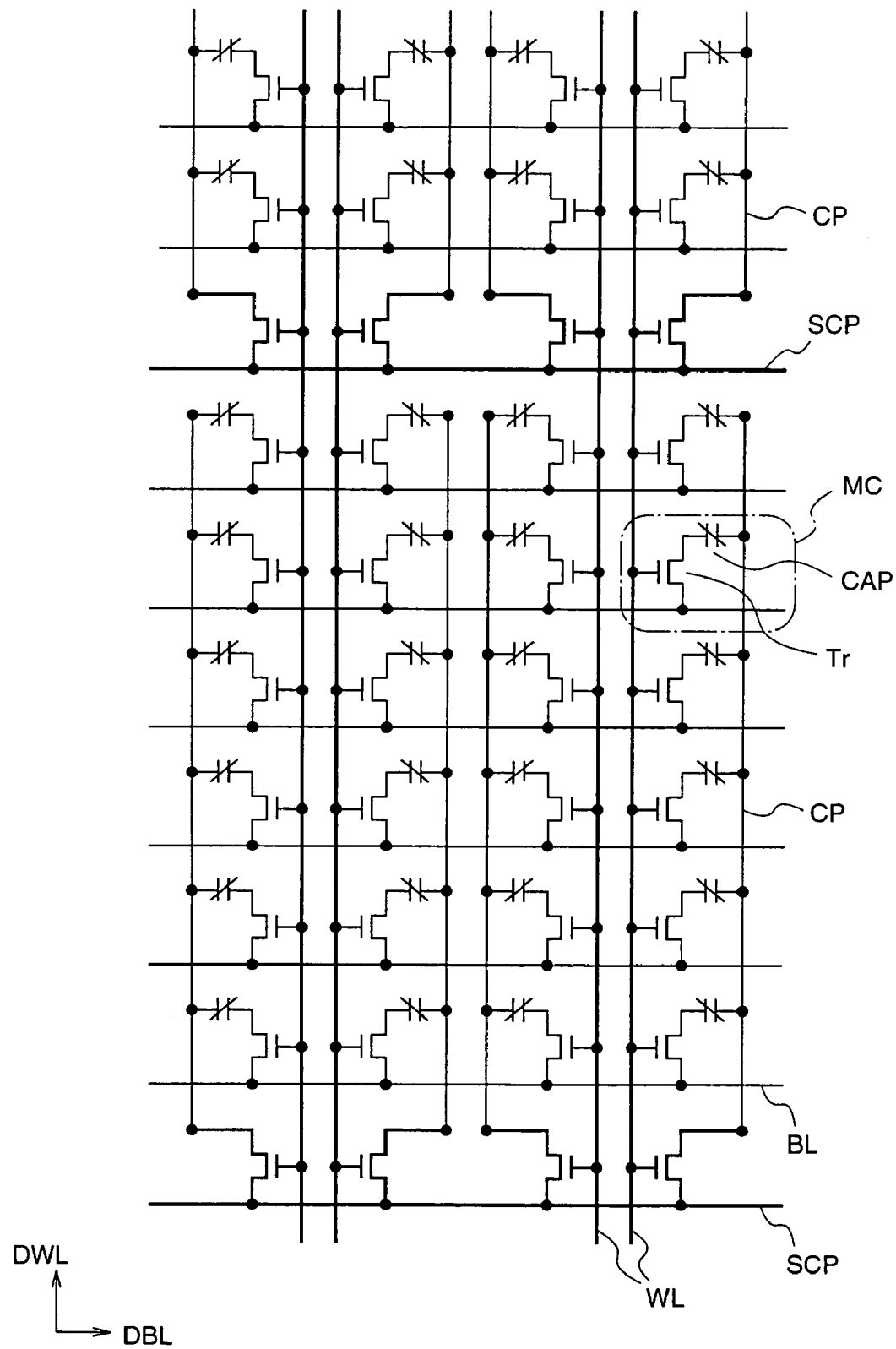
FIG. 7(e) is a circuit schematic view of the memory cell array shown in FIG. 7(a).

FIG. 5(a) is a second plan view for explaining the semiconductor memory device according to the first embodiment, which is obtained by partially expanding FIG. 1 to show a detail of a memory cell array. FIG. 5(b) is a cross-sectional view taken along a line A1-A1' in FIG. 5(a). FIG. 5(c) is a cross-sectional view taken along a line A2-A2' in FIG. 5(a). FIG. 5(d) is a cross-sectional view taken along a line B1-B1' in FIG. 5(a). FIG. 5(e) is a circuit schematic view of the memory cell array shown in FIG. 5(a).

With reference to FIG. 1, in a semiconductor memory device 101 according to the first embodiment, there are disposed plural plate lines CP and plural word lines WL, which extend in the column direction DWL, and plural bit lines BL and plural plate line voltage supply lines SCP, which extend in the row direction. Further, sense amplifier circuits SA and plate line voltage supply circuit CPD are disposed in the column direction DWL so as to abut on a side of a memory cell array MA in the row direction DBL. A pair of a bit line BL and a inverted bit line/BL are connected to one sense amplifier SA, and the plate line voltage supply lines SCP are directly connected to the plate line voltage supply circuits CPD via conductive members such as wirings or plugs.

The plate line voltage supply line SCP is disposed for every six bit lines (including the inverted bit lines), and the plate line voltage supply circuit CPD is disposed for every three sense amplifier circuits SA. The plate line voltage supply circuit CPD contains plural circuit elements, and drives the plate line voltage supply line SCP at a constant voltage when data access is performed on the memory cell.

Further, as shown in FIGS. 5(a)-5(e), in the semiconductor memory device 101 of the first embodiment, a memory transistor Tr is constituted by a diffused layer OD formed in a semiconductor substrate, and a word line WL formed on the semiconductor substrate. The diffused layer OD is electrically connected to the bit line BL that is formed above the plate line CP, by a bit line contact CB, and to a storage node SS by a capacitor contact CS. A capacitor ferroelectric film FE and a plate line CP are successively formed on the storage node SS, thereby constituting a capacitor CAP. The plane line CP is connected to the diffused layer OD through the plate line voltage supply contact CSP, the storage node SS, the capacitor contact CS, and the transistor Tr, and the diffused layer OD is connected to the plate line voltage supply line SCP through the transistor Tr, and the gate of the transistor Tr constitutes the word line WL.

Further, the plate line voltage supply line SCP is connected to the diffused layer OD through the bit line contact CB. The plate line CP is connected to the plate line voltage supply SCP through the transistor Tr formed on the diffused layer OD, and the gate of the transistor Tr constitutes the word line WL.

The plate line voltage supply line SCP is formed of the same layer as that of the bit line BL. The plate voltage supply line SCP and the bit line BL are approximately similar in shape, and the interval between the plate voltage supply line SCP and the adjacent bit line BL is approximately equal to the interval between the adjacent two bit lines BL.

In FIGS. 5(b)~5(d), IR denotes a separation insulating film formed on the semiconductor substrate, and the diffused layer OD is electrically separated from the adjacent diffused layer OD by the separation insulating film IR. In FIG. 5(e), MC denotes a memory cell, and each memory cell MC is constituted by the transistor Tr and the capacitor CAP.

Next, the function and effect will be described.

As described above, according to the semiconductor memory device 101 of the first embodiment, plate line voltage is simultaneously applied to plural portions of one plate line CP, delay of a driving voltage signal in the plate line can be avoided, whereby the plate line voltage can be stabilized, and driving of the plate line can be speeded up. Further, since the plate line voltage supply lines SCP are formed of the same material as the bit lines BL, the plate line voltage supply lines SCP can be easily fabricated without increasing the process steps.

Further, since the plate line voltage is applied from plural plate line voltage supply circuits CPD to one plate line CP, it is not necessary for each plate line voltage supply circuit CPD to have large output ability, and thereby the layout of the plate line voltage supply circuits can be reduced in dimension. Actually, as a result of layout design for the memory cell array MA, the plate line voltage supply circuits CPD, and the sense amplifiers SA, the layout area of the device according to the first embodiment becomes about 70% of the layout area of the conventional device.

To be specific, in this first embodiment, the plural bit lines BL and the plate line voltage supply lines SCP are approximately equal in shape, and these lines are disposed at approximately equal intervals. Further, the storage node SS on which the plate line voltage supply contact CSP is disposed and the storage node SS on which no plate line voltage supply contact CSP is disposed are approximately equal in shape, and these storage nodes SS are disposed at approximately equal intervals. Further, the capacitor contact CS that is electrically connected to the plate line CP and the capacitor contact CS that is not electrically connected to the plate line CP are equal in shape, and these contacts are disposed at approximately equal intervals. Further, the diffused layer OD that is electrically connected to the plate line CP and the diffused layer OD that is not electrically connected to the plate line CP are approximately equal in shape, and these layers are disposed at approximately equal intervals. Furthermore, the bit lines BL and the plate line voltage supply lines SCP are disposed with periodicity. Moreover, the storage nodes SS, the capacitor contacts CS, and the diffused layers OD are disposed with periodicity.

As described above, since many lines of similar shapes are disposed at equal intervals, shape stability and flatness can be improved to improve stability of the fabrication process, and simultaneously, the degree of integration can also be increased. Consequently, variations in element characteristics such as capacitor characteristics can be reduced to provide a highly precise semiconductor memory device.

Further, the plate line voltage supply circuits CPD and the sense amplifier circuits SA are arranged in approximately the same line with periodicity, whereby shape stability and flatness can be improved to provide stable fabrication process and high degree of integration, and further, variations in element characteristics are reduced, resulting in a highly precise semiconductor memory device.

That is, in the plural memory cell lines disposed in the column direction, no plate line voltage supply circuit is disposed between the memory cell lines, whereby periodicity of arrangement of the memory cells can be enhanced, and shape stability is increased during formation of the memory cells, leading to reduction in variations in memory cell characteristics.

Further, between the plate line voltage supply line SCP and the plate line CP, the transistor Tr that electrically connects these lines is disposed, whereby plural plate lines CP which are electrically connectable to the plate line voltage supply line SCP can be selectively driven.

Further, since the gate of the transistor Tr provided between the plate line voltage supply line SCP and the plate line CP is the word line WL, the plate line CP of the memory cell MC connected to the selected word line WL can be automatically selected. Accordingly, it is not necessary to newly provide a signal for selecting plate lines, whereby the circuit structure of the semiconductor memory device, including the circuit structure for selecting plate lines CP, can be simplified.

Furthermore, since one plate line voltage supply line SCP is connected to one plate line voltage supply circuit CPD, different voltages can be supplied to the respective plate line voltage supply lines. While the circuit structure in which one plate line voltage supply line SCP is connected to one plate line voltage supply circuit CPD is mainly used in a plate line driving type memory cell array, since the supply voltage is variable for each plate line voltage supply line, reduced power consumption can be realized.

The shapes and layouts of the plate line voltage supply lines SCP, the storage nodes SS, the capacitor contacts CS, the diffused layers OD and the like in the memory array are not restricted to those described for the first embodiment.

For example, the bit line BL and the plate line voltage supply line SCP may have different shapes, and the interval between adjacent bit line BL and plate line voltage supply line SCP may be varied. Further, the storage node SS on which the plate line voltage is disposed and the storage node SS on which no plate line voltage is disposed may have different shapes, and the disposition interval of the adjacent storage nodes may be varied. The capacitor contact CS that is electrically connected to the plate line CP and the capacitor contact CS that is not electrically connected to the plate line CP may have different shapes, and the disposition interval of the adjacent contacts may be varied. Further, the diffused layer OD that is electrically connected to the plate line CP and the diffused layer OD that is not electrically connected to the plate line CP may have different shapes, and the disposition interval of the adjacent diffused layers may be varied. Further, at least one plate line voltage supply circuit is disposed for plural plate lines extending in the column direction, whereby the area of the plate line voltage supply circuit can be reduced.

As described above, even when the shapes and layouts of the plate line voltage supply lines SCP, the storage nodes SS, the capacitor contacts CS, the diffused layers OD and the like are different from those described for the first embodiment, it is also possible to obtain the effects of the first embodiment, such as increase in the speed of driving the plate line voltage supply lines SCP, and reduction in the resistances of the plate line voltage supply contacts CSP and the capacitor contacts CS that are electrically connected to the plate lines CP, depending on the structures thereof.

While in the first embodiment the plate line voltage supply line SCP is disposed for every six bit lines (including the inverted bit lines) and the plate line voltage supply circuit CPD is disposed for every three sense amplifier circuits SA, the number of the bit lines disposed between the adjacent plate line voltage supply lines SCP and the number of the sense amplifier circuits disposed between the adjacent plate line voltage supply circuits CPD are not restricted to those described for the first embodiment, and these numbers may be arbitrarily changed according to the structure of the memory array.

Embodiment 2

Hereinafter, a second embodiment of the present invention will be described with reference to FIGS. 2 and 6.

Figure 2:
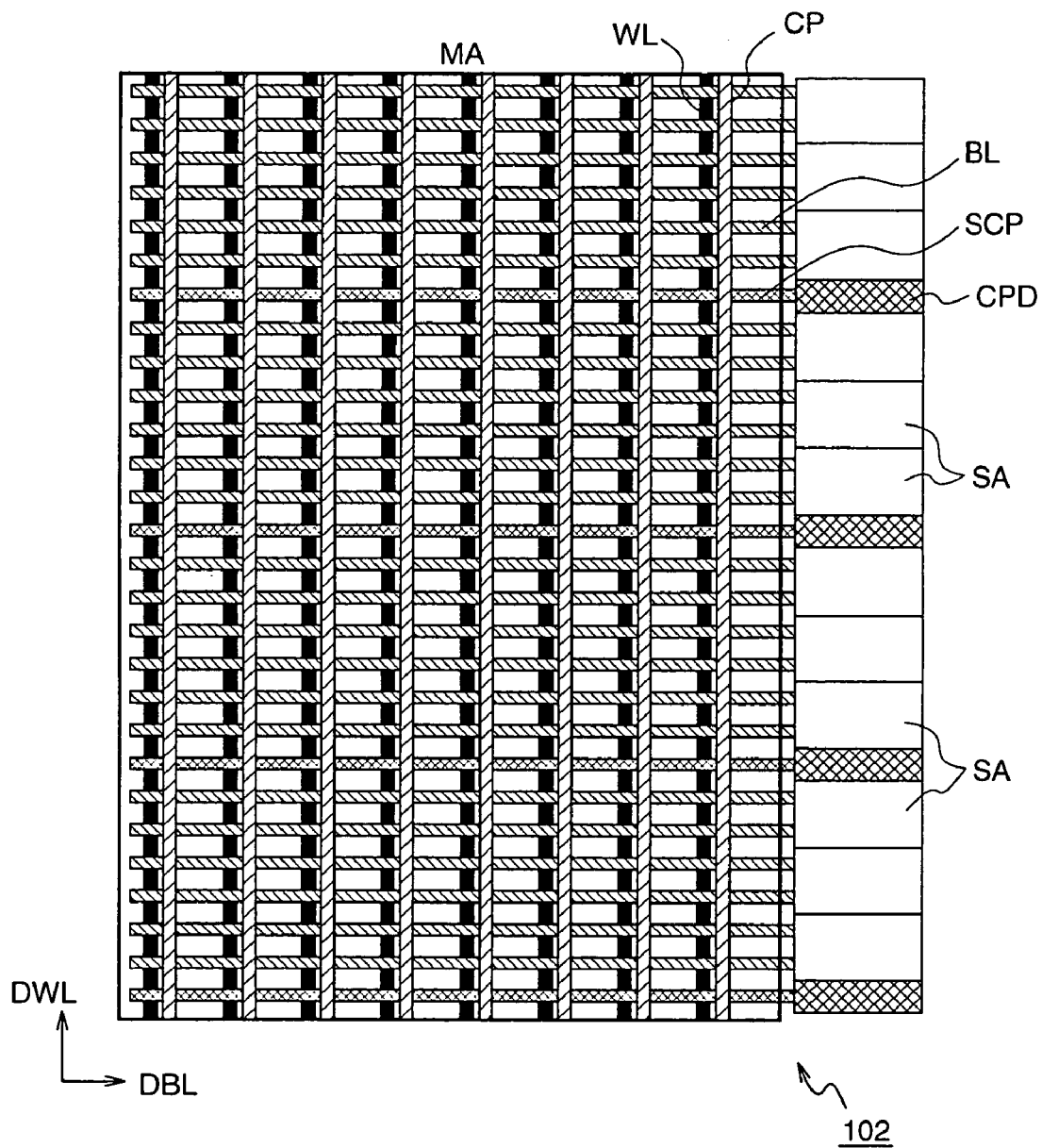
FIG. 2 is a plan view for explaining a semiconductor memory device according to a second embodiment of the present invention.

FIG. 2 is a first plan view for conceptually illustrating a semiconductor memory device according to the second embodiment of the present invention.

FIG. 6(*a*) is a second plan view for explaining the semiconductor memory device according to the second embodiment, which is obtained by partially expanding FIG. 2 to show a detail of a memory cell array. FIG. 6(*b*) is a cross-sectional view taken along a line A1-A1' in FIG. 6(*a*). FIG. 6(*c*) is a cross-sectional view taken along a line A2-A2' in FIG. 6(*a*). FIG. 6(*d*) is a cross-sectional view taken along a line B1-B1' in FIG. 6(*a*). FIG. 6(*e*) is a circuit schematic view of the memory cell array shown in FIG. 6(*a*).

In the semiconductor memory device according to the second embodiment, the bit lines BL and the plate line voltage supply lines SCP are disposed beneath the plate lines CP as shown in FIGS. 2 and 6, while in the first embodiment the bit lines BL and the plate line voltage supply lines SCP are disposed above the plate lines CP.

In the semiconductor memory device according to the second embodiment, since the bit line contacts CB are positioned beneath the plate lines CP and the storage nodes SS, a space for disposing the bit line contact between the adjacent capacitors is dispensed with, whereby the degree of integration relating to the plate lines CP and the storage nodes SS is increased as compared with that of the first embodiment, resulting in further reduction in the area of the ferroelectric memory device.

Further, the high degree of integration relating to the plate lines CP and the storage nodes SS, which leads to miniaturization of the area of the substrate occupied by the memory cell array, results in uniformization of the processes in the fabrication, thereby providing a higher precision semiconductor memory device due to more shape-stabilization and flatness as compared with the first embodiment.

Furthermore, since the gates of the transistors connected to the plate line voltage supply lines SCP are connected to the word lines, the plate lines can be operated in synchronization with the word lines, whereby the circuit operating mode can be simplified. Further, since the word lines and the gates of the transistors can be constituted by a common wiring, a semiconductor memory device with reduced area of memory cells can be obtained.

Embodiment 3

Hereinafter, a third embodiment of the present invention will be described with reference to FIGS. 3 and 7.

Figure 3:
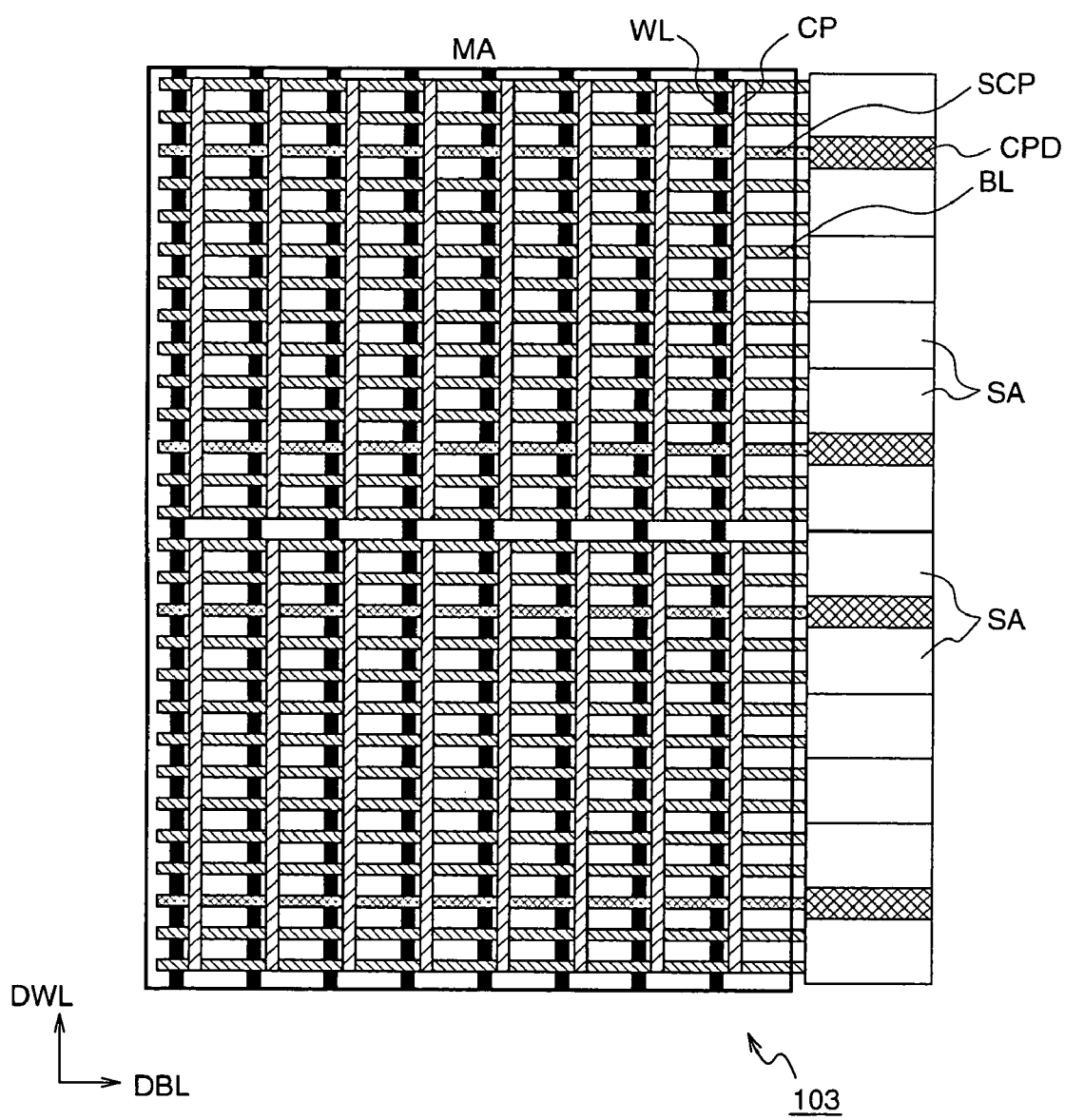
FIG. 3 is a plan view for explaining a semiconductor memory device according to a third embodiment of the present invention.

FIG. 3 is a first plan view for conceptually illustrating a semiconductor memory device according to the third embodiment of the present invention.

FIG. 7(*a*) is a second plan view for explaining the semiconductor memory device according to the third embodiment, which is obtained by partially expanding FIG. 3 to show a detail of a memory cell array. FIG. 7(*b*) is a cross-sectional view taken along a line A1-A1' in FIG. 7(*a*). FIG. 7(*c*) is a cross-sectional view taken along a line A2-A2' in FIG. 7(*a*). FIG. 7(*d*) is a cross-sectional view taken along a line B1-B1' in FIG. 7(*a*). FIG. 7(*e*) is a circuit schematic view of the memory cell array shown in FIG. 7(*a*).

Hereinafter, differences between the second embodiment and the third embodiment will be described with reference to FIGS. 2 and 3.

In the semiconductor memory device according to the third embodiment, plural plate lines CP and plural word lines WL, which extend in the column direction DWL, are disposed as in the second embodiment, as shown in FIGS. 2 and 3. However, in this third embodiment, the number of memory cells relating to the plate lines CP is smaller than the number of memory cells relating to the word lines WL, while in the second embodiment the number of memory cells relating to the word lines WL are equal to the number of memory cells relating to the plate lines CP.

In the third embodiment constituted as mentioned above, since the plate lines CP are divisionally disposed, the load capacitance of each plate line CP can be reduced, whereby delay in driving the plate lines CP is further reduced to increase the speed of driving the plate lines CP. Further, the voltage of the plate lines CP can be stabilized, whereby the area of each plate line voltage supply circuit can be further reduced.

Furthermore, according to the construction of the third embodiment, plural plate line voltage supply circuits can be selectively operated, whereby further reduction in power consumption is achieved.

Embodiment 4

Hereinafter, a fourth embodiment of the present invention will be described with reference to FIGS. 4 and 8.

Figure 4:
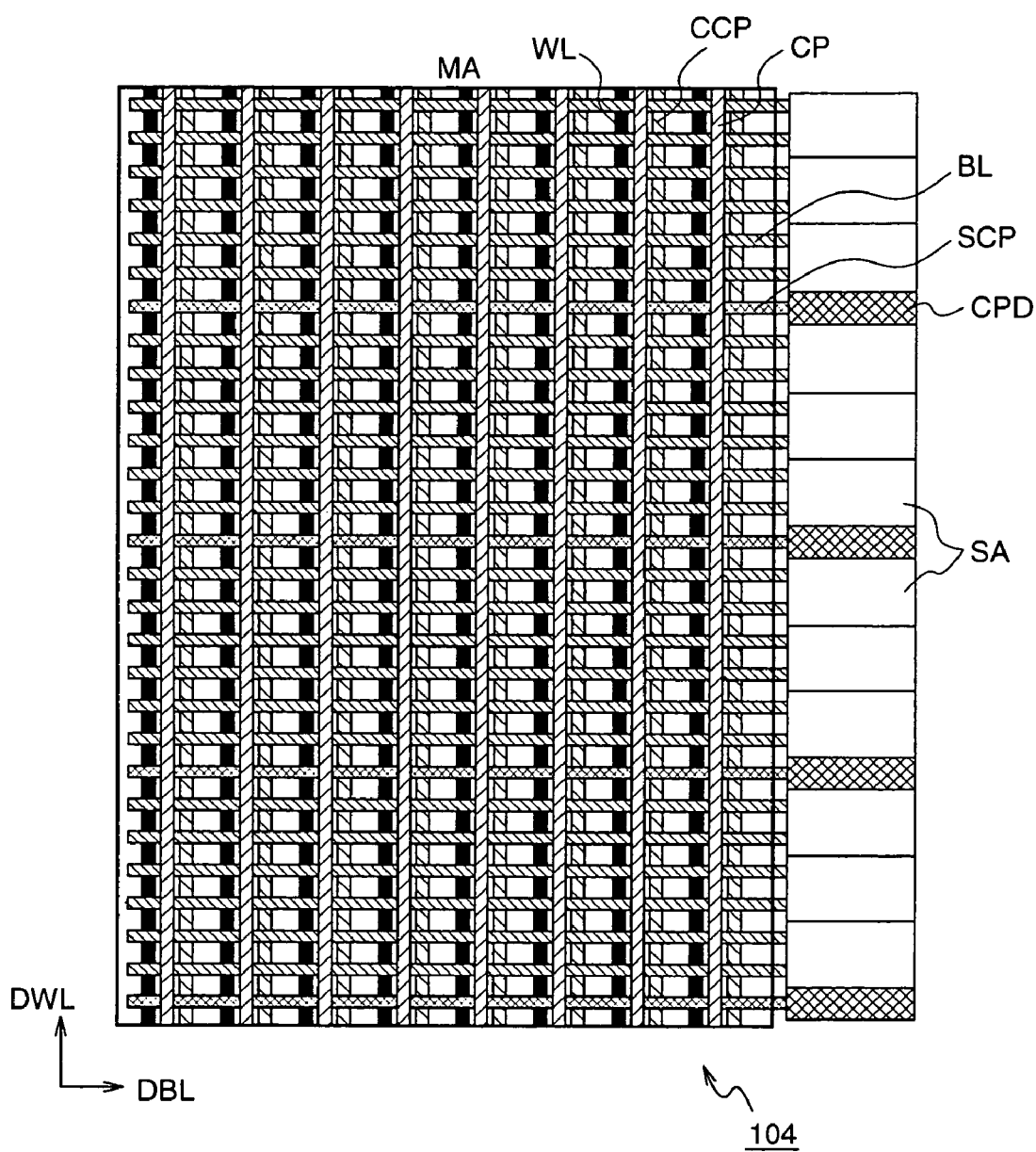
FIG. 4 is a plan view for explaining a semiconductor memory device according to a fourth embodiment of the present invention.

FIG. 4 is a first plan view for conceptually illustrating a semiconductor memory device according to the fourth embodiment of the present invention.

FIG. 8(*a*) is a second plan view for explaining the semiconductor memory device according to the fourth embodiment, which is obtained by partially expanding FIG. 4 to show a memory cell array in detail. FIG. 8(*b*) is a cross-sectional view taken along a line A1-A1' in FIG. 8(*a*). FIG. 8(*c*) is a cross-sectional view taken along a line A2-A2' in FIG. 8(*a*). FIG. 8(*d*) is a cross-sectional view taken along a line B1-B1' in FIG. 8(*a*). FIG. 8(*e*) is a circuit schematic view of the memory cell array shown in FIG. 8(*a*).

Hereinafter, differences between the second embodiment and the fourth embodiment will be described with reference to FIGS. 2, 4, 6, and 8.

In the second embodiment, as shown in FIGS. 2 and 6, the plate lines CP and the word lines WL extending in the column direction DWL are disposed. In this fourth embodiment, as shown in FIGS. 4 and 8, in addition to the plate lines CP and the word lines WL of the second embodiment, plate line driving signal lines CCP extending in the column direction DWL are disposed.

Figure 8A:
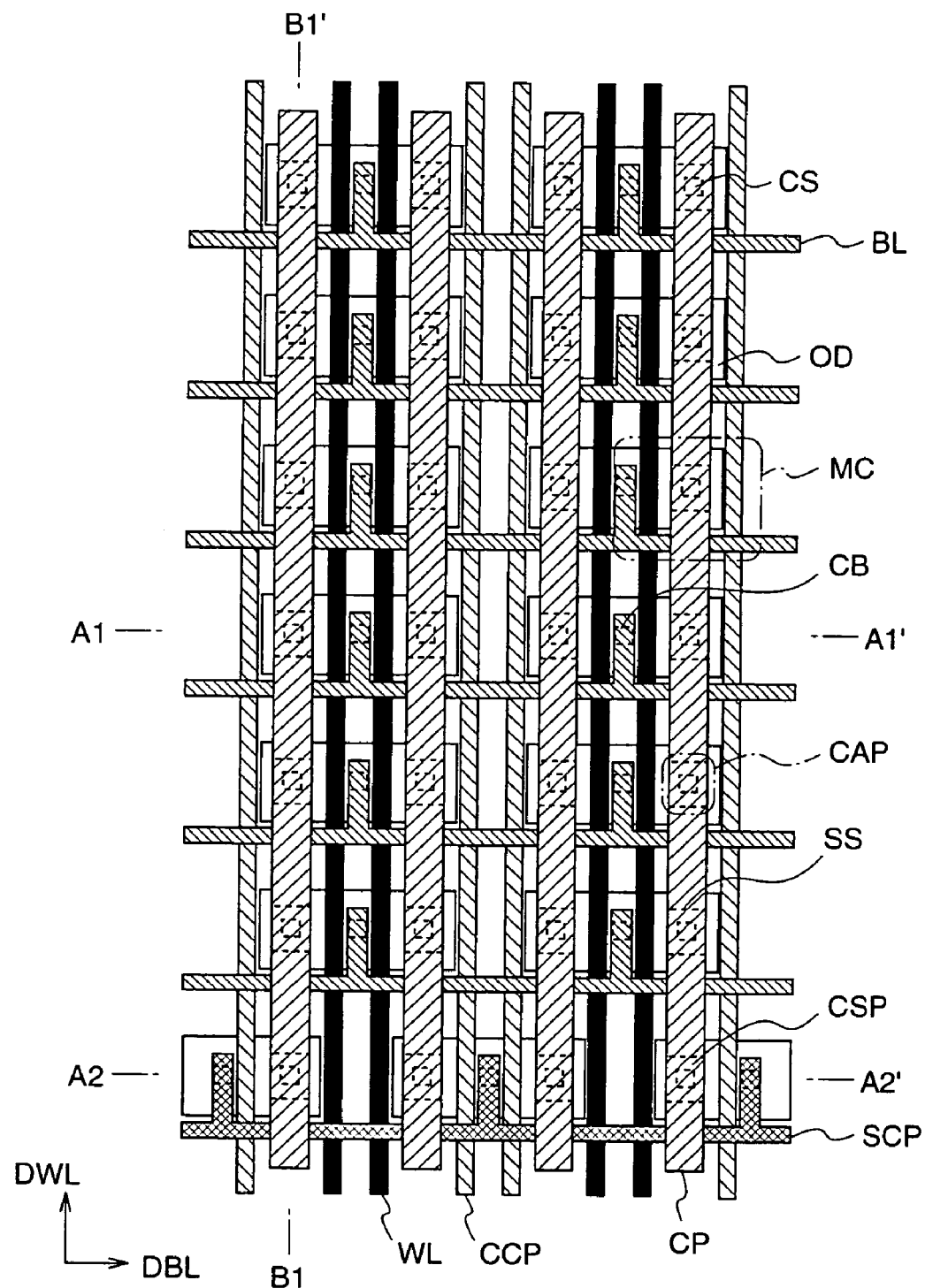
FIG. 8(a) is a plan view illustrating a memory cell array in the semiconductor memory device according to the fourth embodiment.
Figure 8B:
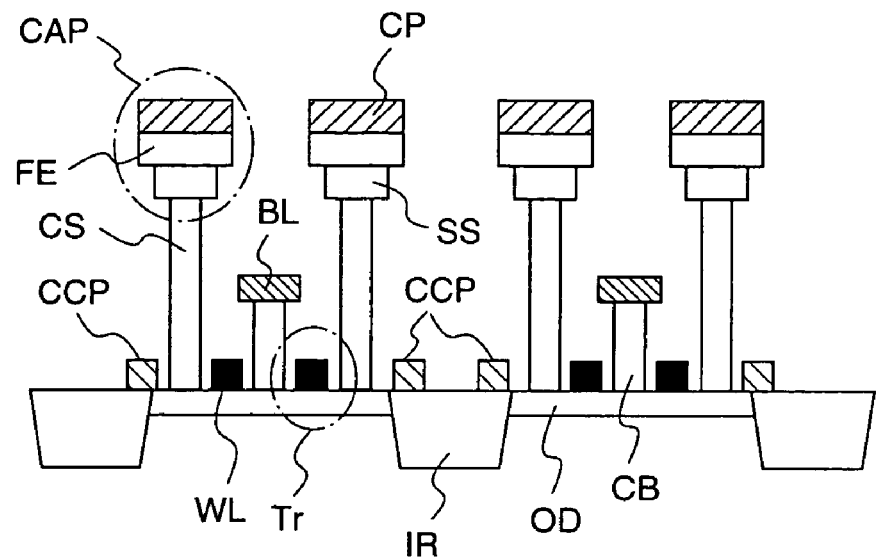
FIG. 8(b) is a cross-sectional view taken along a line A1-A1' in FIG. 8(a).
Figure 8C:
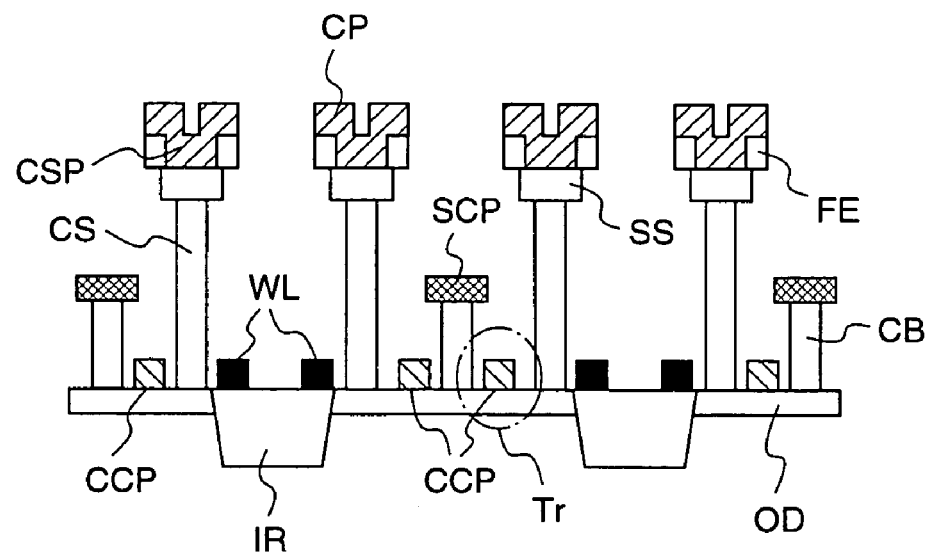
FIG. 8(c) is a cross-sectional view taken along a line A2-A2' in FIG. 8(a).
Figure 8D:
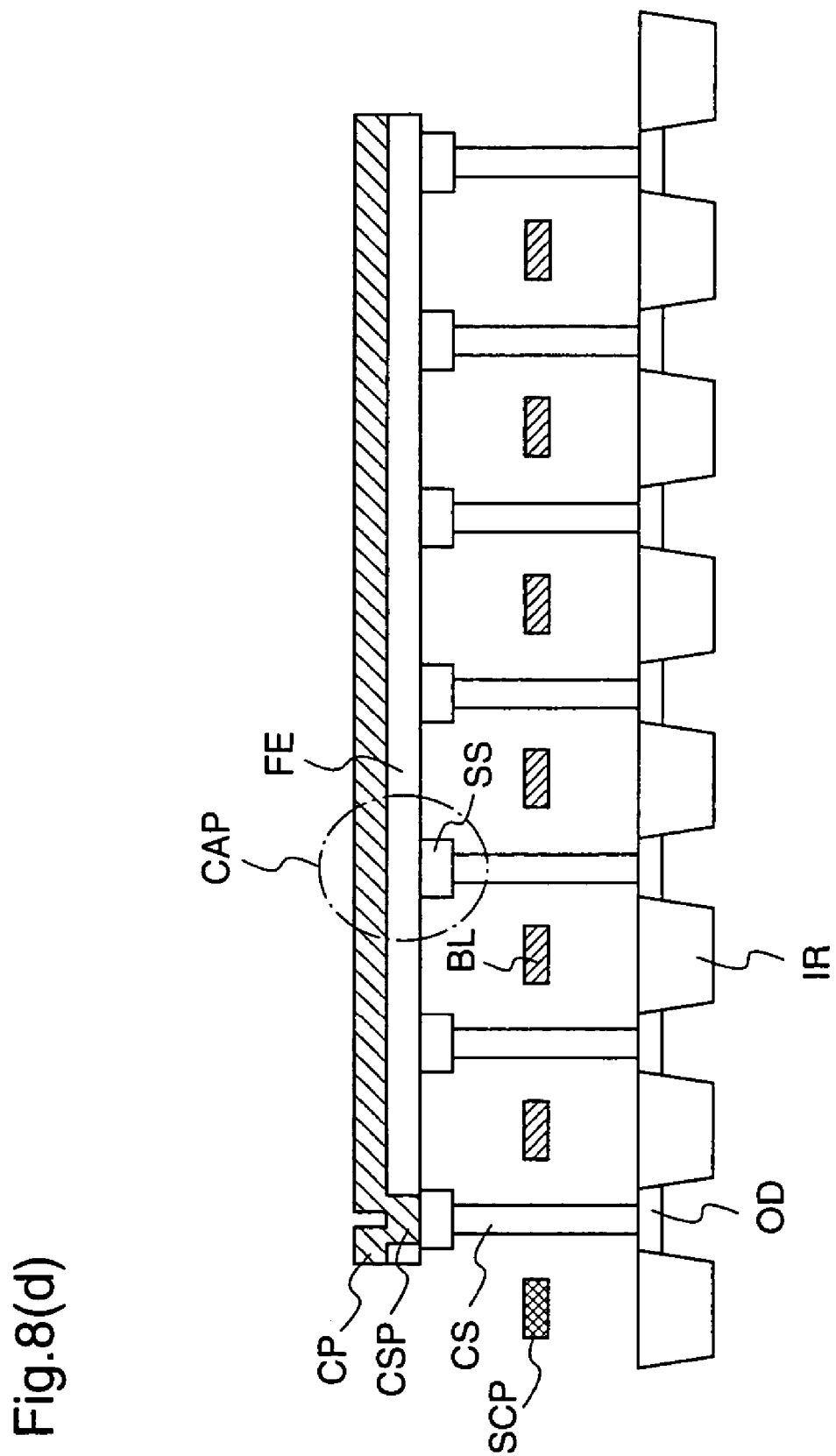
FIG. 8(d) is a cross-sectional view taken along a line B1-B1' in FIG. 8(a).
Figure 8E:
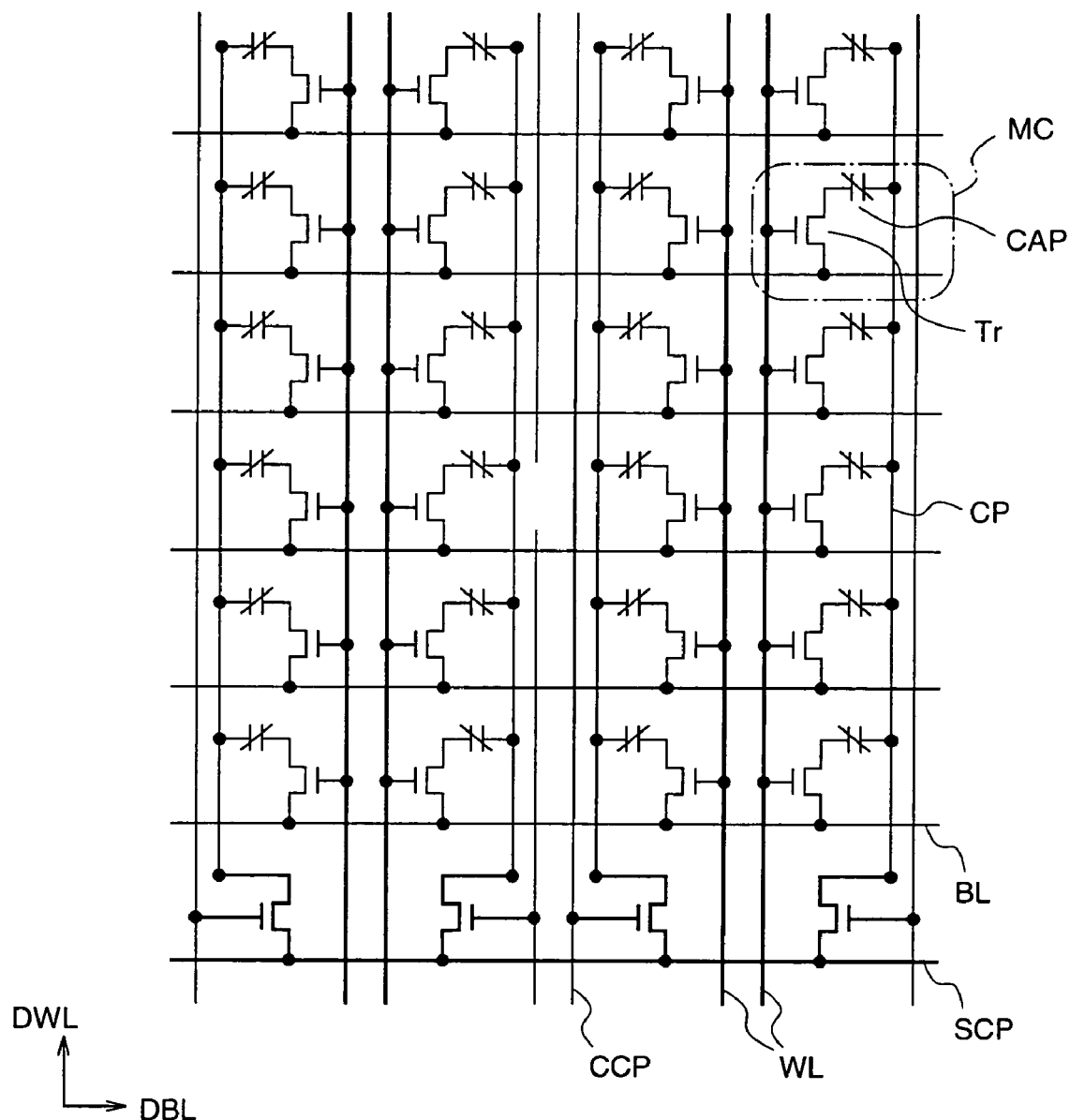
FIG. 8(e) is a circuit schematic view of the memory cell array shown in FIG. 8(a).

Further, as shown in FIG. 8(c), the plate line driving signal lines CCP are formed of the same layers as the word lines WL, and the gates of the transistors connected to the plate line voltage supply lines SCP are the plate line driving signal lines CCP.

In the fourth embodiment constituted as mentioned above, since the gates of the transistors connected to the plate line voltage supply lines SCP are constituted not by the word lines WL but by the plate line driving signal lines CCP, the plate lines CP can be driven asynchronously with the word lines WL, or the voltage of the plate line voltage supply lines SCP can be fixed, thereby realizing speed-up of the circuit.

Further, since the voltage of the plate line voltage supply line SCP is fixed, it is not necessary to drive the plate line voltage supply line SCP, whereby the circuit scale of the plate line voltage supply circuit CPD can be reduced, and the power consumption of the plate line voltage supply circuit CPD can be reduced, and furthermore, the area of the plate line voltage supply circuit CPD can be reduced.

Embodiment 5

Hereinafter, a fifth embodiment of the present invention will be described with reference to FIGS. 9 and 10.

Figure 9:
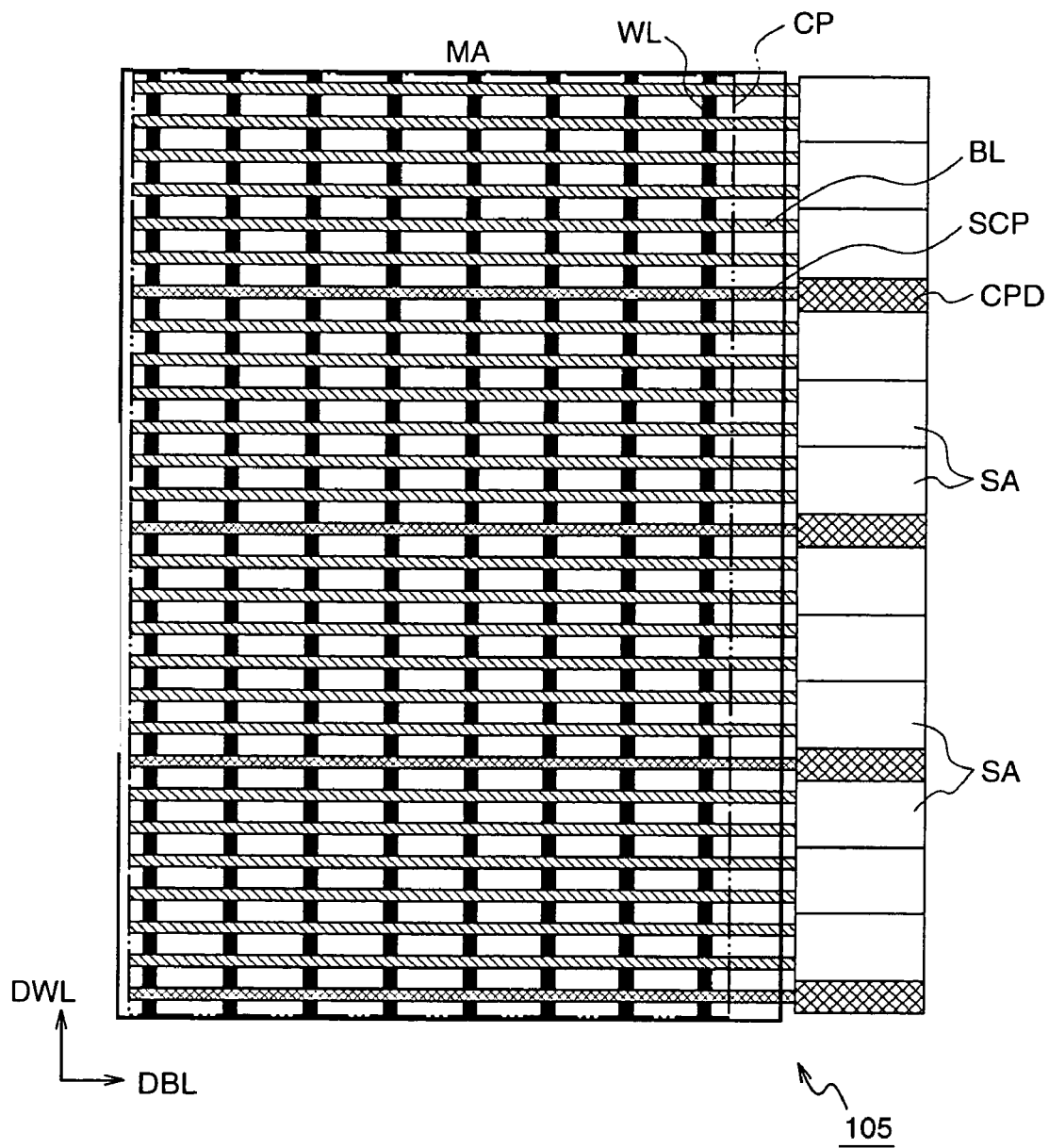
FIG. 9 is a plan view for explaining a semiconductor memory device according to a fifth embodiment of the present invention.

FIG. 9 is a first plan view for conceptually illustrating a semiconductor memory device according to the fifth embodiment of the present invention.

Figure 10A:
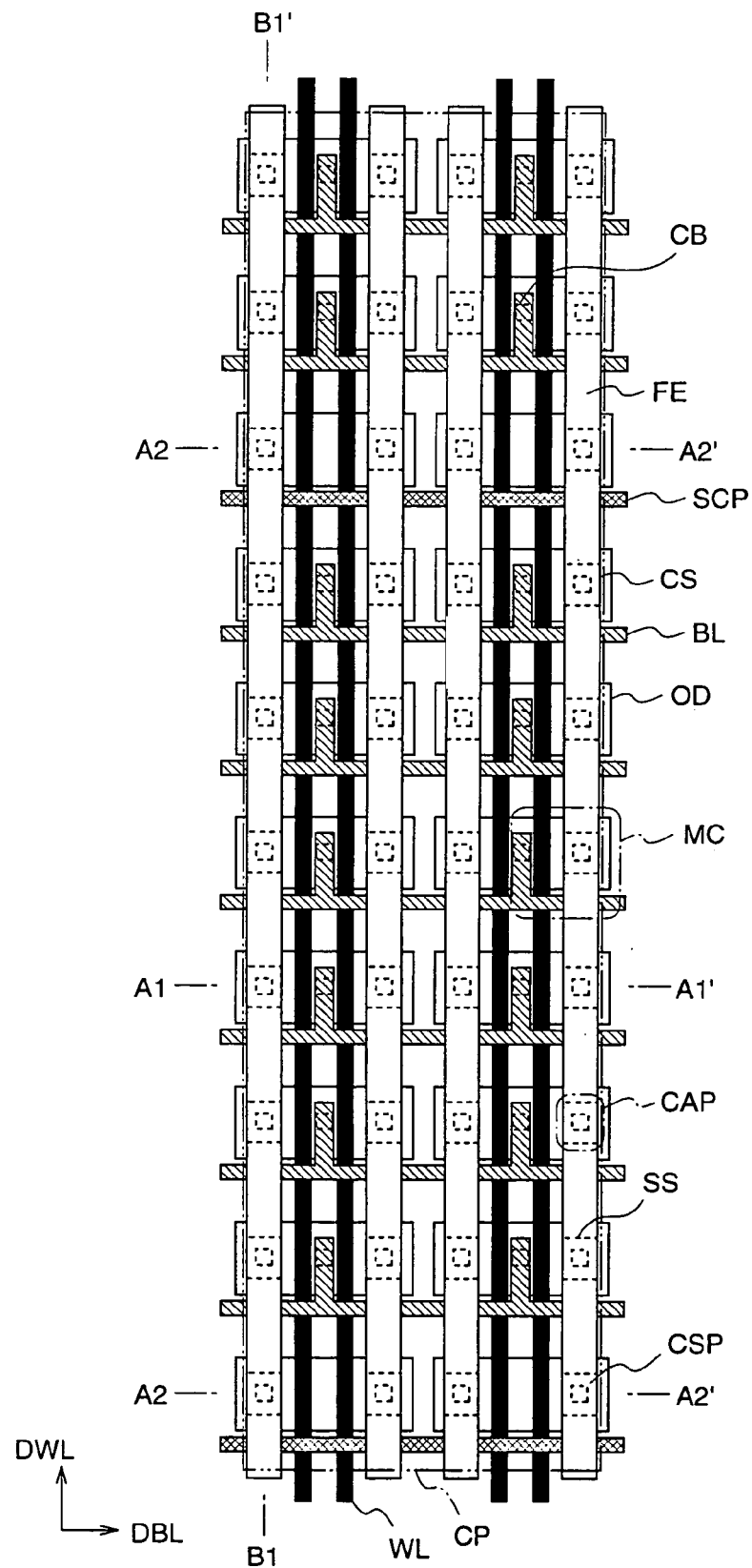
FIG. 10(a) is a plan view illustrating a memory cell array in the semiconductor memory device according to the fifth embodiment.
Figure 10B:
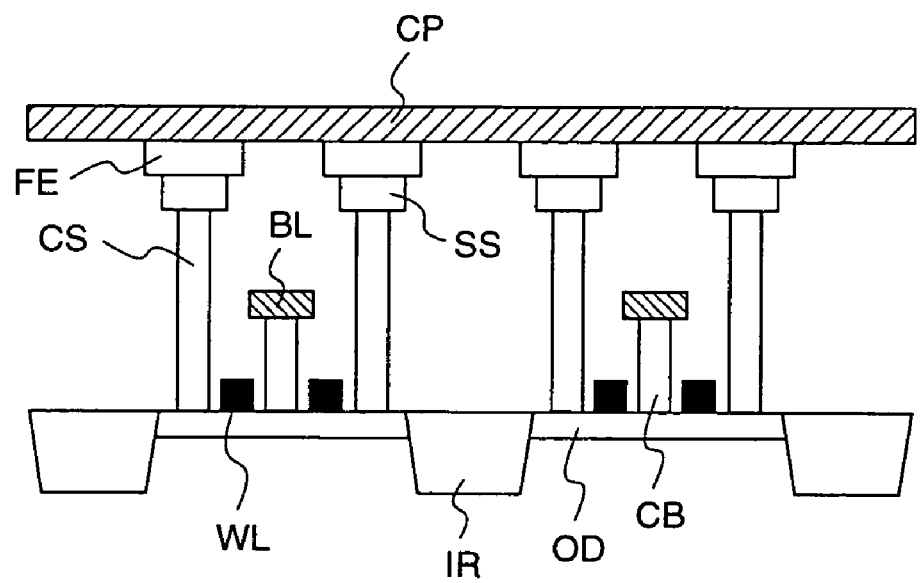
FIG. 10(b) is a cross-sectional view taken along a line A1-A1' in FIG. 10(a)
Figure 10C:
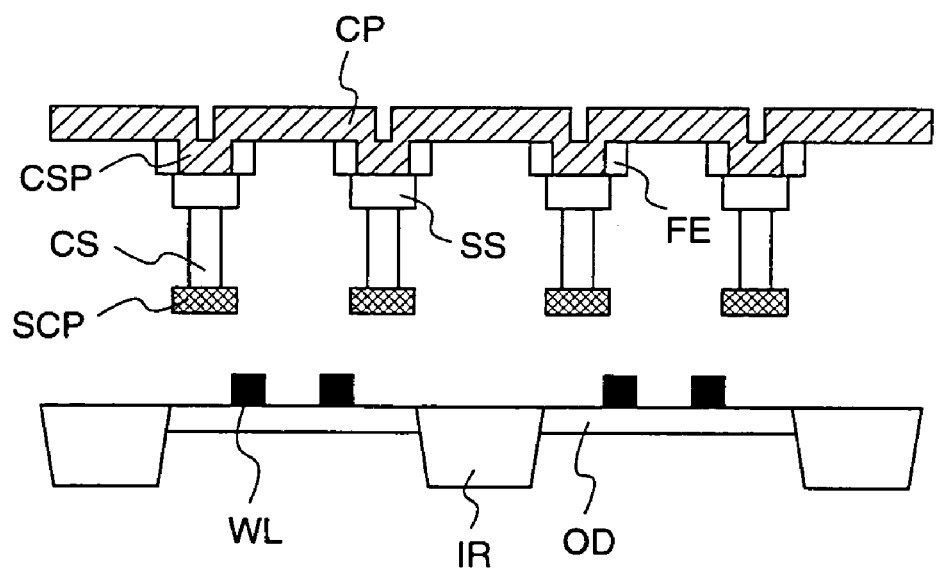
FIG. 10(c) is a cross-sectional view taken along a line A2-A2' in FIG. 10(a).
Figure 10D:
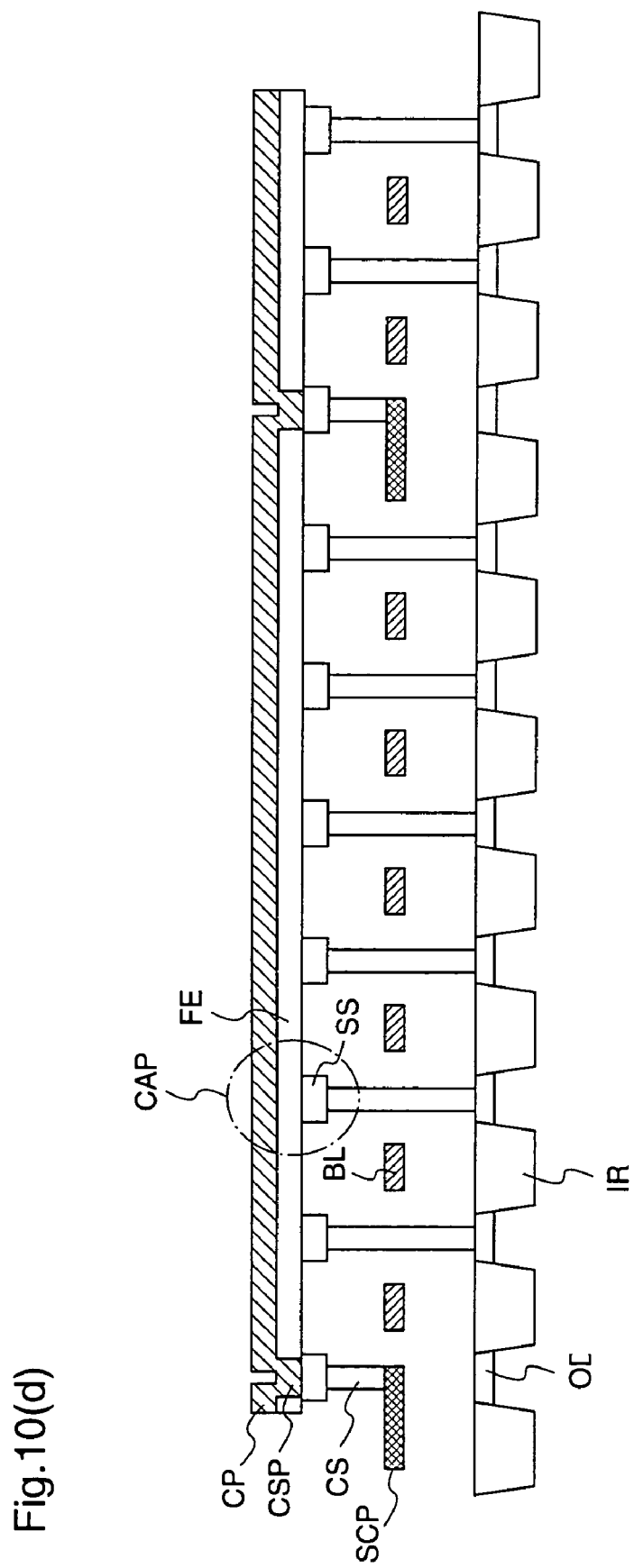
FIG. 10(d) is a cross-sectional view taken along a line B1-B1' in FIG. 10(a).
Figure 10E:
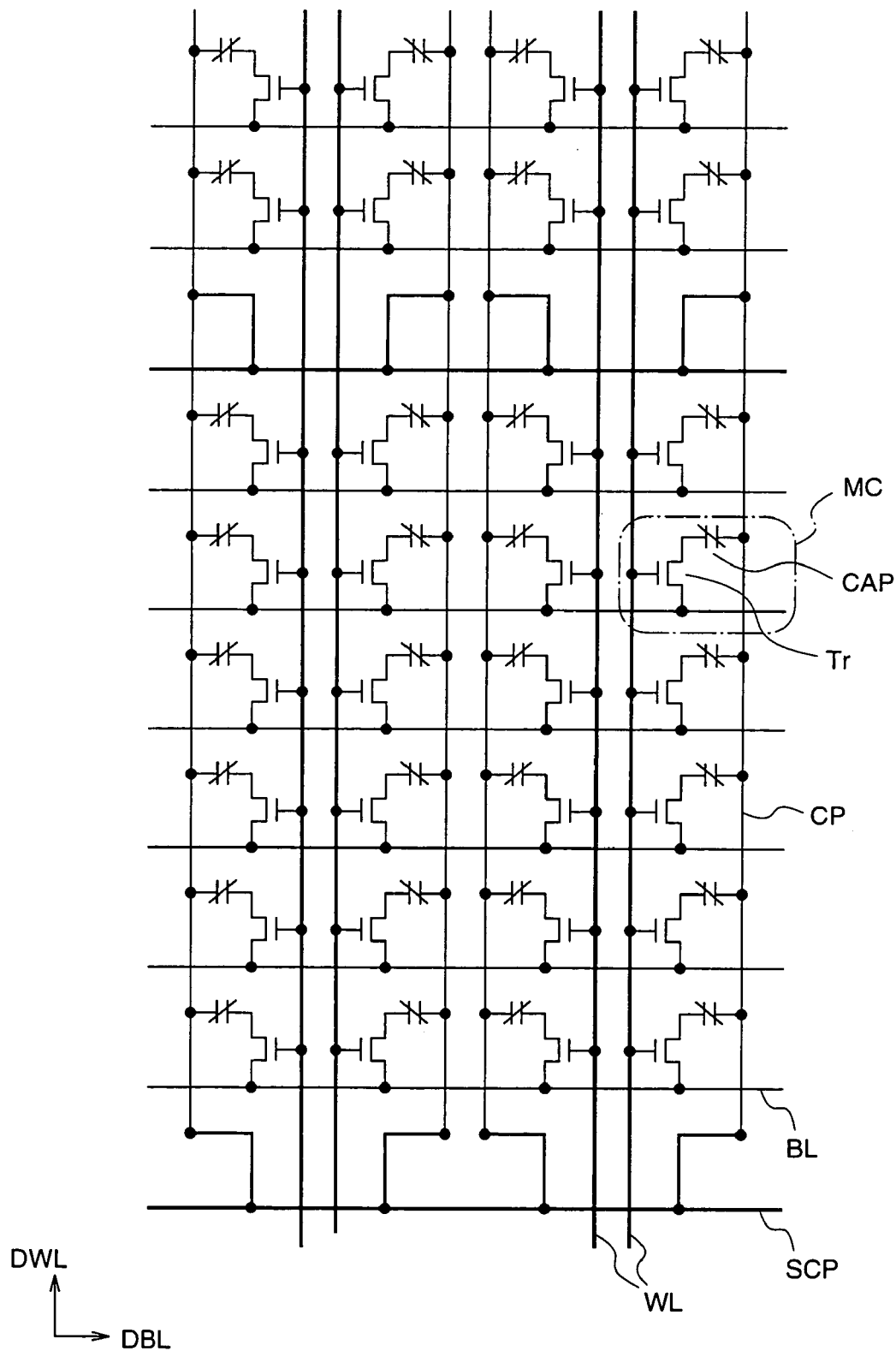
FIG. 10(e) is a circuit schematic view of the memory cell array shown in FIG. 10(a).
Figure 11:
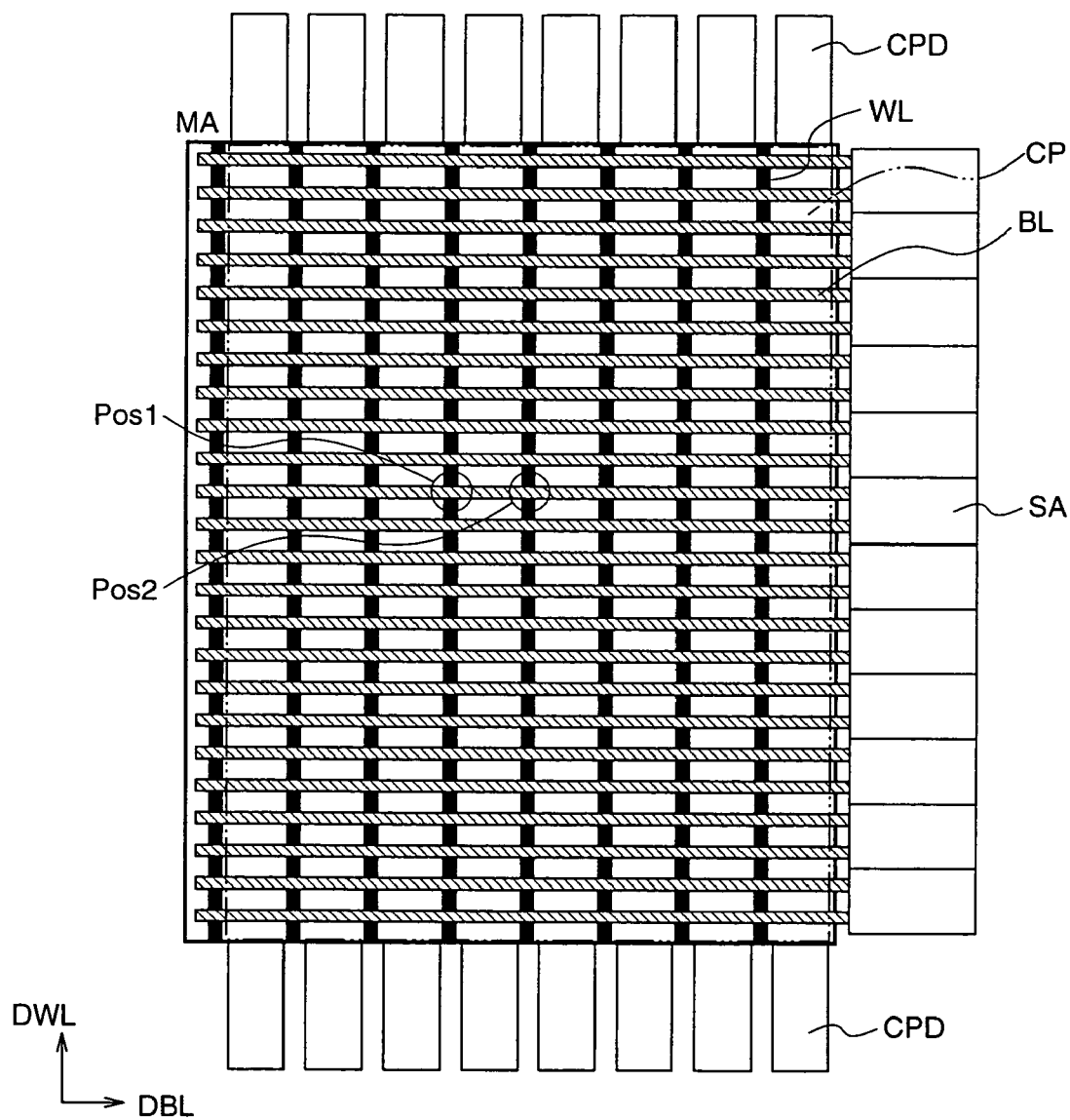
FIG. 11 is a plan view for explaining the conventional semiconductor memory device disclosed in Patent Document 1.
Figure 12:
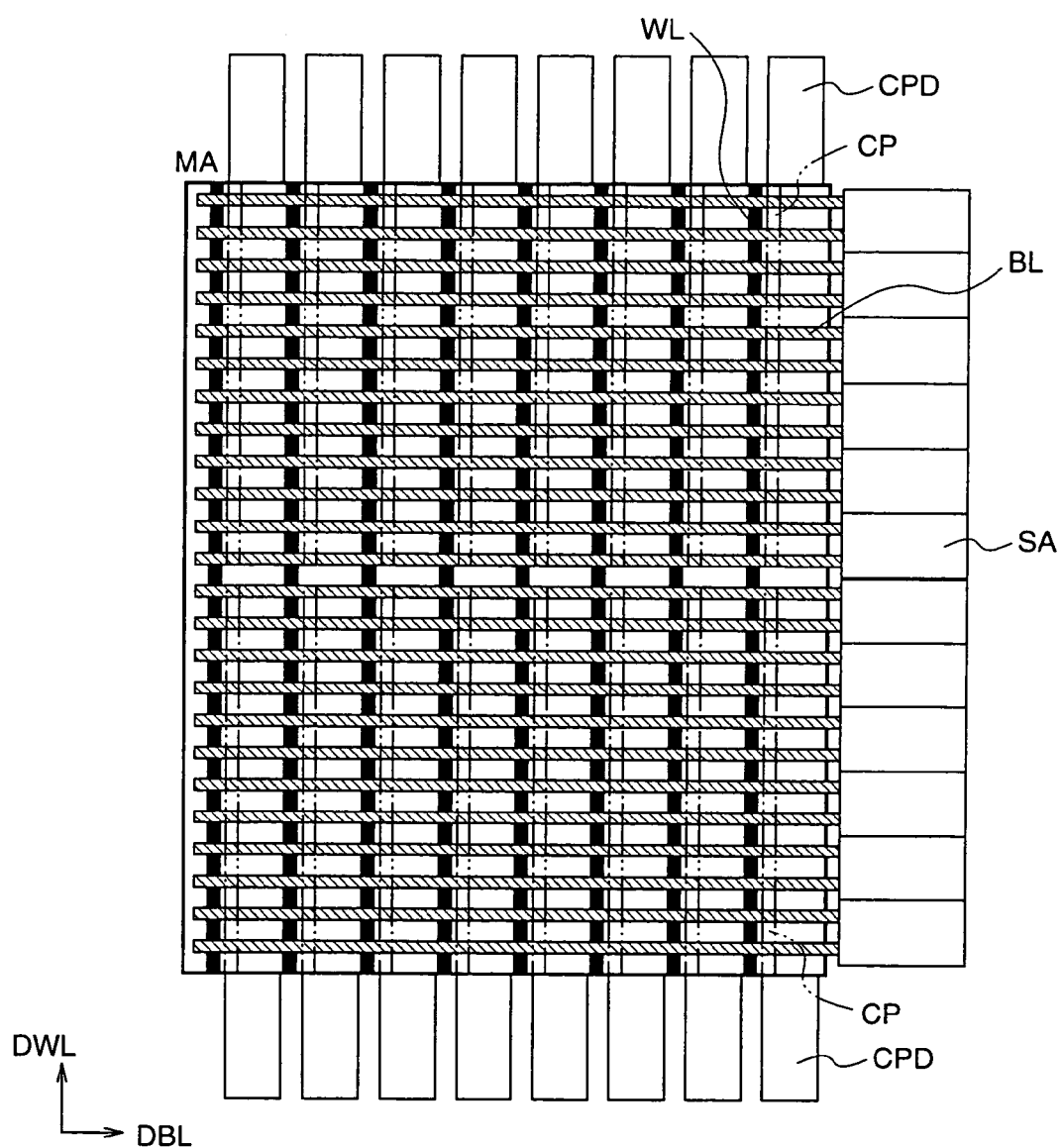
FIG. 12 is a plan view for explaining the conventional semiconductor memory device disclosed in Patent Document 2.

FIG. 10(a) is a second plan view for explaining the semiconductor memory device according to the fifth embodiment, which is obtained by partially expanding FIG. 9 to show a memory cell array in detail. FIG. 10(b) is a cross-sectional view taken along a line A1-A1' in FIG. 10(a). FIG. 10(c) is a cross-sectional view taken along a line A2-A2' in FIG. 10(a). FIG. 10(d) is a cross-sectional view taken along a line B1-B1' in FIG. 10(a). FIG. 10(e) is a circuit schematic view of the memory cell array shown in FIG. 10(a).

Hereinafter, differences between the second embodiment and the fifth embodiment will be described with reference to FIGS. 2 and 9, and further, FIGS. 6 and 10.

In the second embodiment, as shown in FIG. 2, the plural plate lines CP as many as the plural word lines WL extending in the column direction DWL are disposed with respect to the word lines WL. However, in this fifth embodiment, as shown in FIG. 9, one plate line CP is disposed with respect to the plural word lines extending in the column direction DWL.

Further, in the second embodiment, as shown in FIG. 6, the plate line voltage supply line SCP is connected to the plate line CP through the bit line contact CB, the transistor Tr whose gate is the word line WL, and the capacitor contact CS. However, in this fifth embodiment, as shown in FIG. 10(c), the plate line voltage supply line SCP is directly connected to the plate line CS by the capacitor contact CS, with no transistor intervening between them.

Further, in this fifth embodiment, the plate line CP is disposed so as to cover the plural storage nodes SS laying side-by-side in the DWL direction and the plural storage nodes SS laying side-by-side in the row direction DBL.

In the semiconductor memory device according to the fifth embodiment, it is possible to easily realize an operation system with the voltage of the plate line being fixed.

Particularly, in the layout where one plate line CP is disposed for plural word lines WL, when a specific memory cell is operated, since the resistance of the plate line in a non-operating memory cell disposed in the vicinity of the operating memory cell is high, shortage of supply voltage to the plate line CP occurs temporarily and selectively, whereby the voltage of the plate line is likely to occur local undershoot or overshoot, leading to deterioration in data holding of the memory cell. In this fifth embodiment, however, voltage can be supplied to the one plate line arranged for the plural word lines WL, at plural positions on the plate line in the row direction as well as the column direction, whereby the voltage of the plate line can be stabilized.

Further, in this fifth embodiment, since it is not necessary to drive the voltage of the plate line CP during operation, further speed-up of the operation of the ferroelectric memory device can be achieved.

Furthermore, in this fifth embodiment, it is not necessary to drive the voltage of the plate line CP during operation, and the voltage of the plate line voltage supply line SCP can be fixed, which means that driving of the plate line voltage supply line SCP becomes unnecessary. Therefore, when the voltage of the plate line voltage supply line SCP is fixed, the circuit scale of the plate line voltage supply circuit CPD can be reduced, and the power consumption of the plate line voltage supply circuit CPD can be reduced, and further, a reduction in the area of the plate line voltage supply circuit CPD can be realized.

While in the first to fifth embodiments the semiconductor memory device is a ferroelectric memory using ferroelectric capacitors as capacitors constituting memory cells, the semiconductor memory device may be a dynamic type memory using high-k dielectric capacitors as memory cell capacitors. Also in this case, as in the first to fifth embodiments, speed-up of the plate line driving and high integration of the plate line voltage supply circuit can be realized.

Further, while in the first to fifth embodiments the plate line voltage supply lines SCP are formed of the same layer as the bit lines BL, the plate line voltage supply lines SCP may be formed of a layer different from the layer of the bit lines BL.

Embodiment 6

FIGS. 13(a)~13(d) illustrate a semiconductor memory device according to a sixth embodiment of the present invention.

Figure 13A:
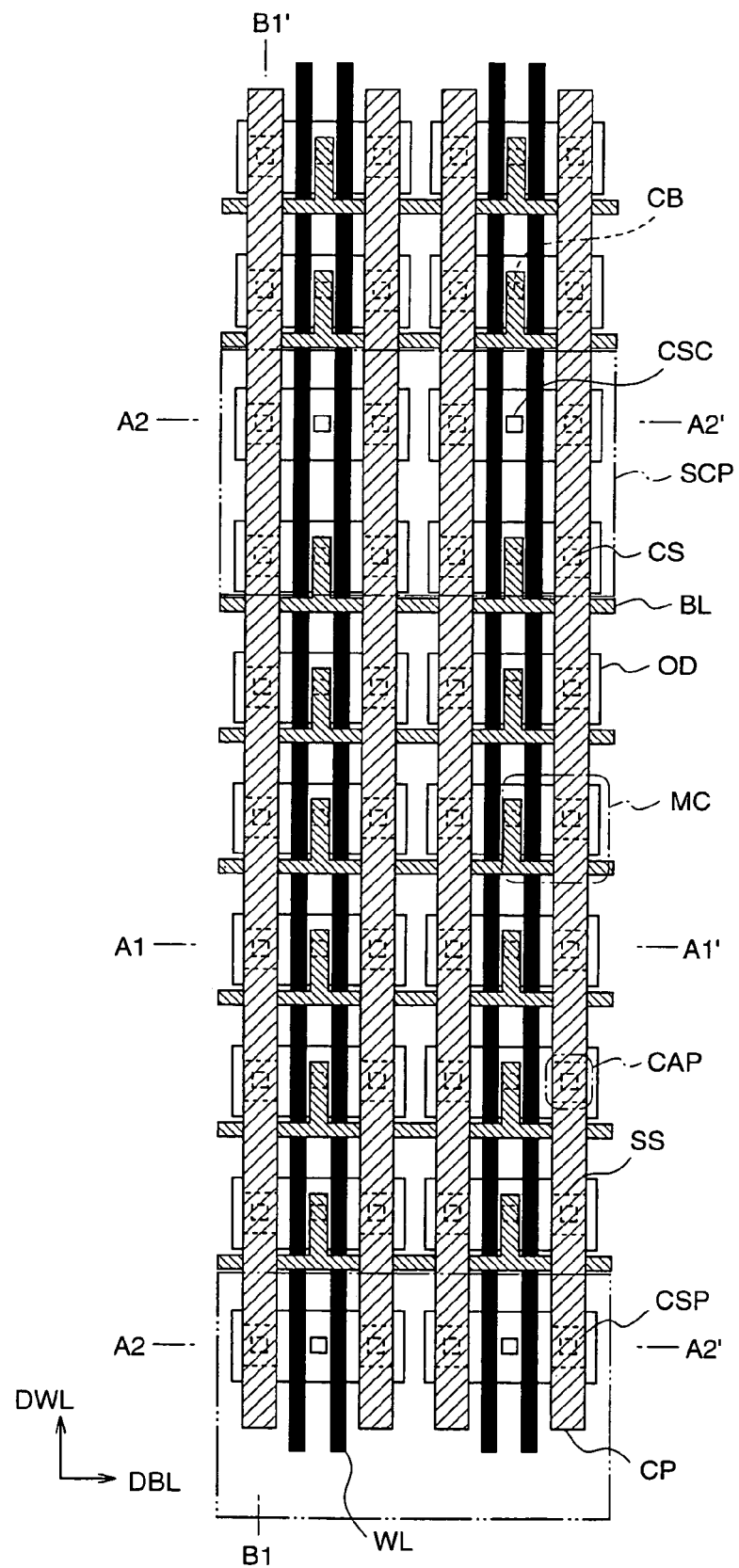
FIG. 13(a) is a plan view for explaining an example wherein bit lines and plate line voltage supply lines are formed of different layers, in a semiconductor memory device according to a sixth embodiment of the present invention.
Figure 13B:
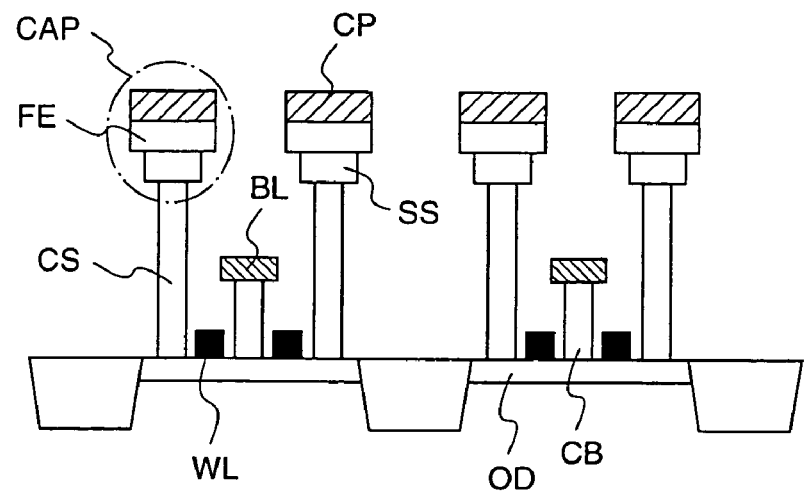
FIG. 13(b) is a cross-sectional view taken along a line A1-A1' in FIG. 13(a).
Figure 13C:
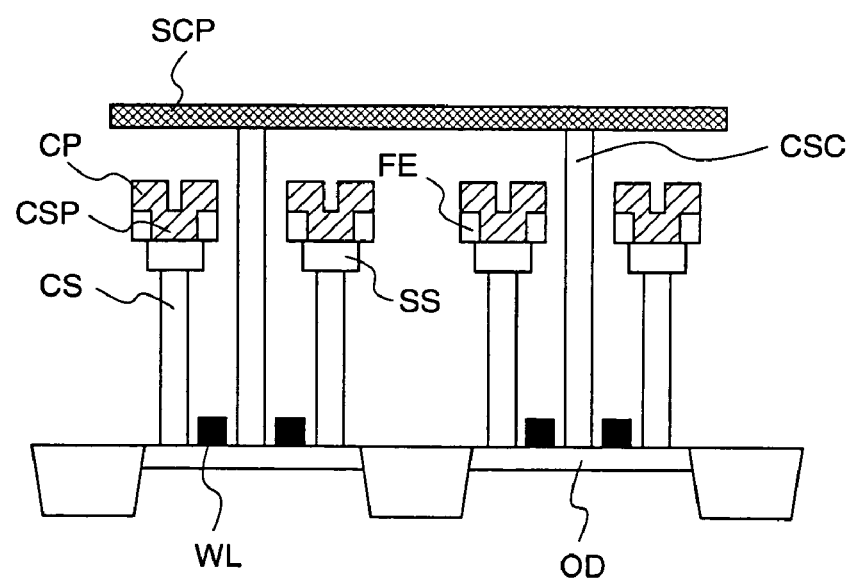
FIG. 13(c) is a cross-sectional view taken along a line A2-A2' in FIG. 13(a).
Figure 13D:
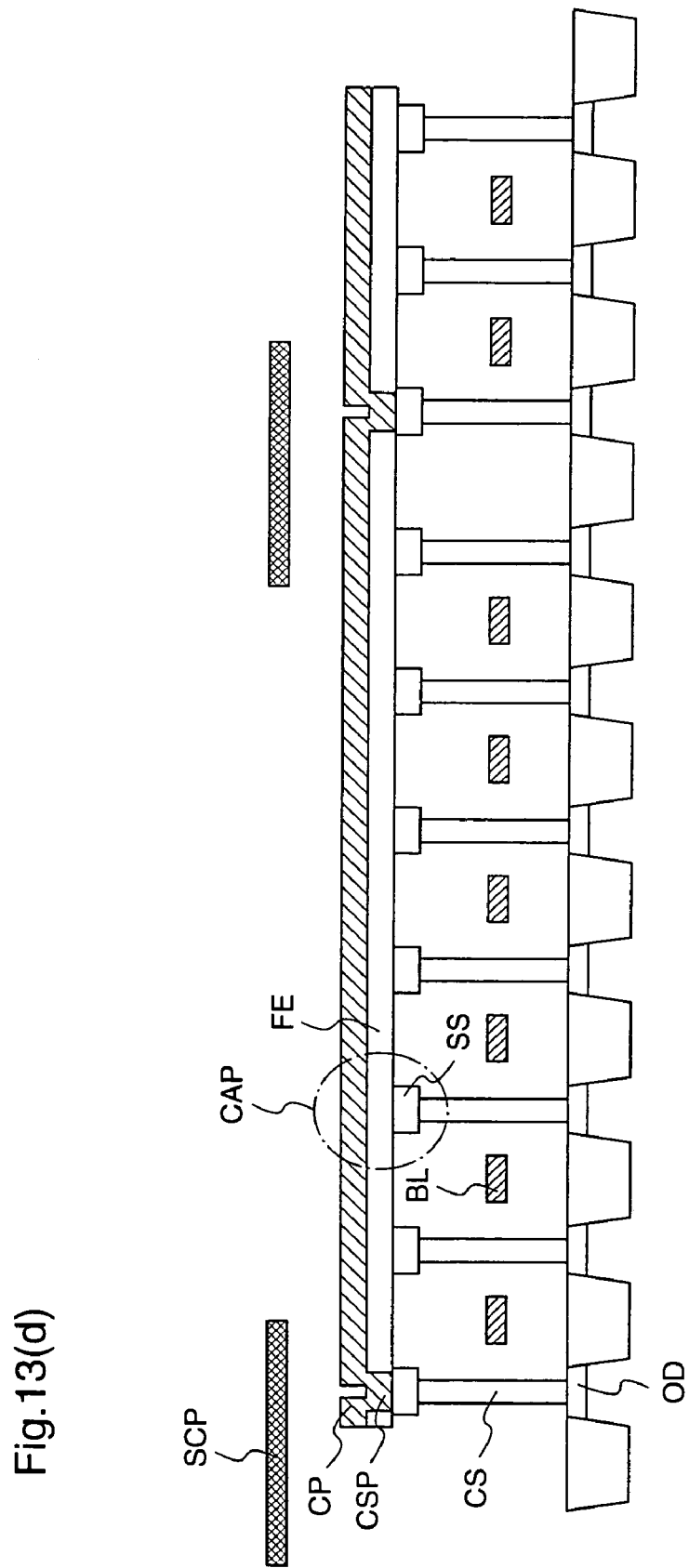
FIG. 13(d) is a cross-sectional view taken along a line B1-B1' in FIG. 13(a).
Figure 13E:
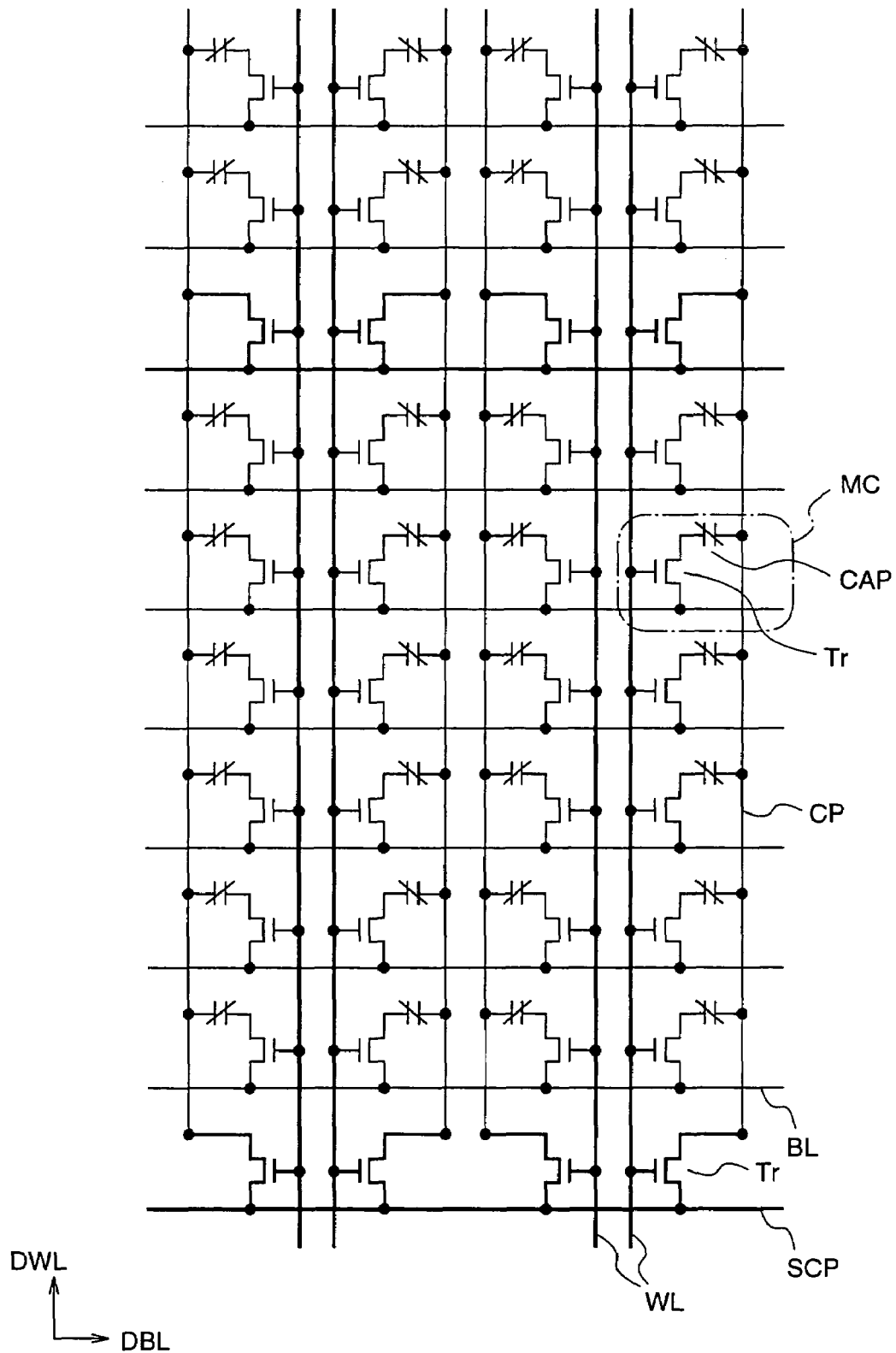
FIG. 13(e) is a circuit schematic view of the memory cell array shown in FIG. 13(a).

FIG. 13(a) is a plan view illustrating a memory cell array, FIG. 13(b) is a cross-sectional view taken along a line A1-A1' in FIG. 10(a), FIG. 13(c) is a cross-sectional view taken along a line A2-A2' in FIG. 13(a), and FIG. 13(d) is a cross-sectional view taken along a line B1-B1' in FIG. 13(a). FIG. 13(e) is a circuit schematic view of the memory cell array shown in FIG. 13(a).

In the semiconductor memory device according to the sixth embodiment, as shown in FIGS. 13(a)~13(d), the plate line voltage supply lines SCP are formed of a layer positioned above a layer constituting the capacitors CAP, and the bit lines BL are formed of a layer positioned beneath the layer constituting the capacitors CAP.

In this sixth embodiment, while the bit lines BL are connected to the diffused layers OD through the bit line contacts CB as in the first embodiment, the plate line voltage supply lines SCP are connected to the diffused layers OD through wiring contacts CSC other than the bit line contacts CB.

In this sixth embodiment, since the plate line voltage supply lines SCP are formed of a layer positioned above the layer constituting the capacitors CAP while the bit lines BL are formed of a layer positioned beneath the layer constituting the capacitors CAP, the wiring width of the plate line voltage supply lines SCP can be increased as compared with the case where these lines are formed of the same layer, whereby speed-up of data access to the memory cell can be achieved.

In this sixth embodiment, the plate line voltage supply lines SCP are formed of a layer positioned above the layer constituting the capacitors CAP while the bit lines BL are formed of a layer positioned beneath the layers constituting the capacitors CAP. However, the positional relationship between the plate line voltage supply lines SCP and the bit lines BL may be inverted from that shown in FIGS. 13(a)~13(d), that is, the plate line voltage supply lines SCP may be formed of a layer positioned beneath the layer constituting the capacitors CAP while the bit lines BL may be formed of a layer positioned above the layer constituting the capacitors CAP.

Also in this case, the wiring width of the plate line voltage supply line SCP can be increased as compared with the case where the plate line voltage supply lines SCP and the bit lines BL are formed of the same layer, whereby speed-up of data access to the memory cells can be achieved.

Embodiment 7

FIGS. 14(a)~14(d) are diagrams illustrating a semiconductor memory device according to a seventh embodiment of the present invention.

Figure 14A:
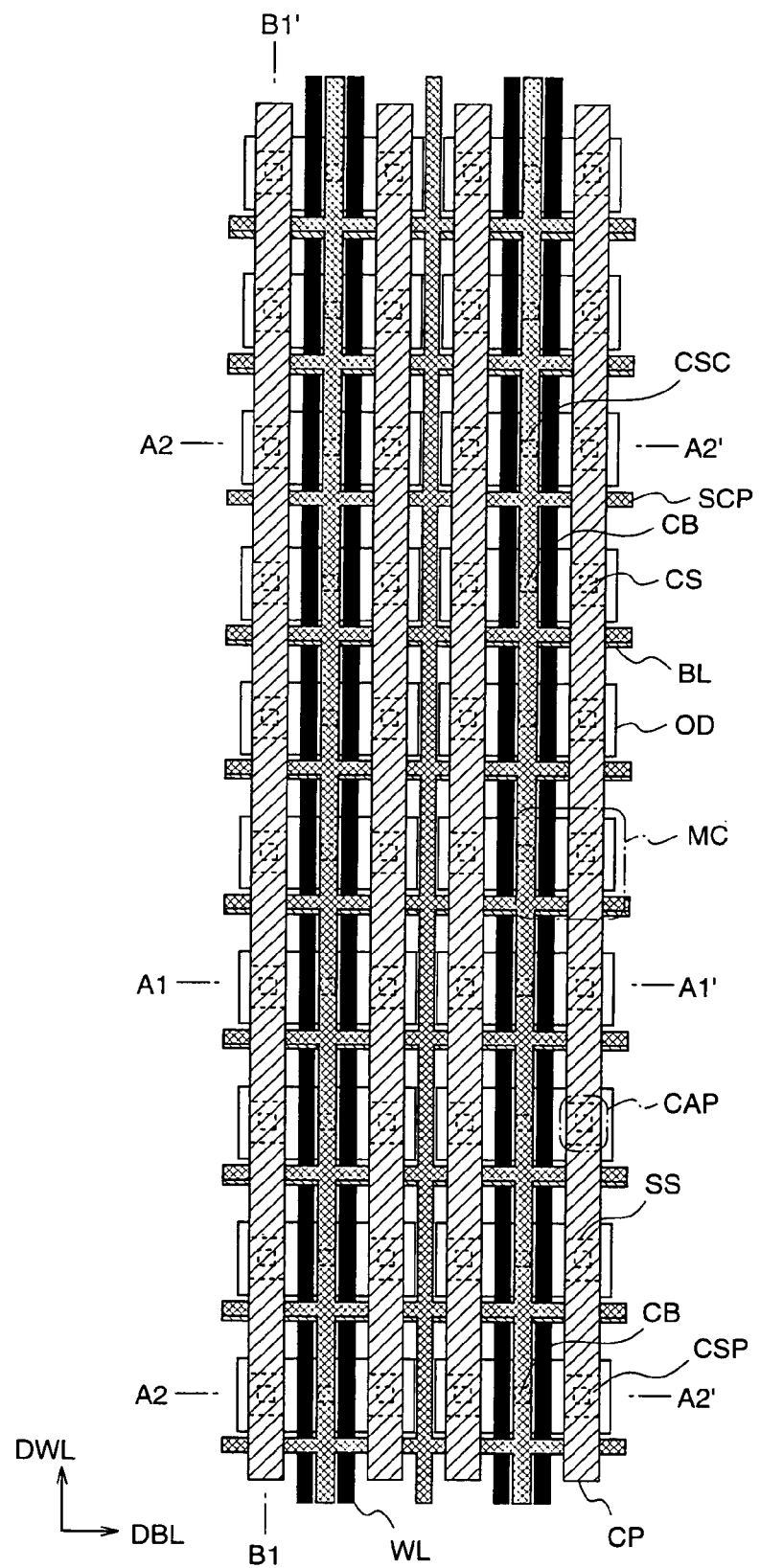
FIG. 14(a) is a plan view for explaining an example wherein bit lines and plate line voltage supply lines are formed of different layers, in a semiconductor memory device according to a seventh embodiment of the present invention.
Figure 14B:
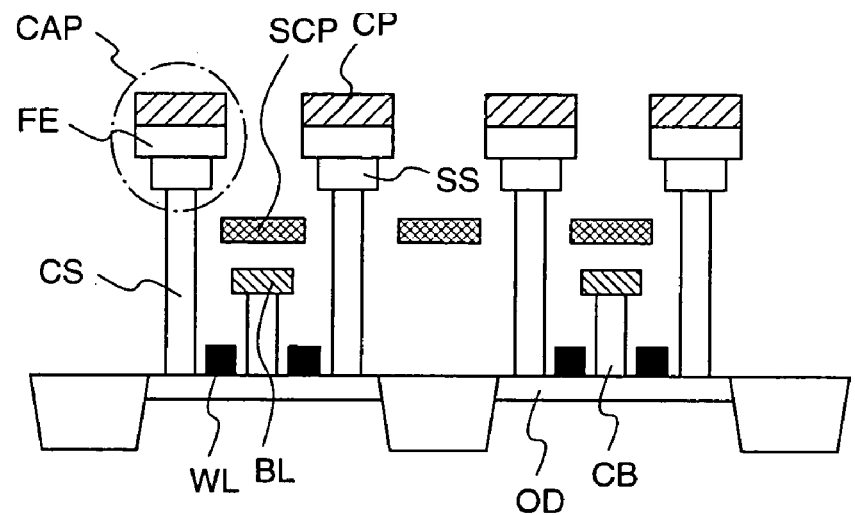
FIG. 14(b) is a cross-sectional view taken along a line A1-A1' in FIG. 14(a).
Figure 14C:
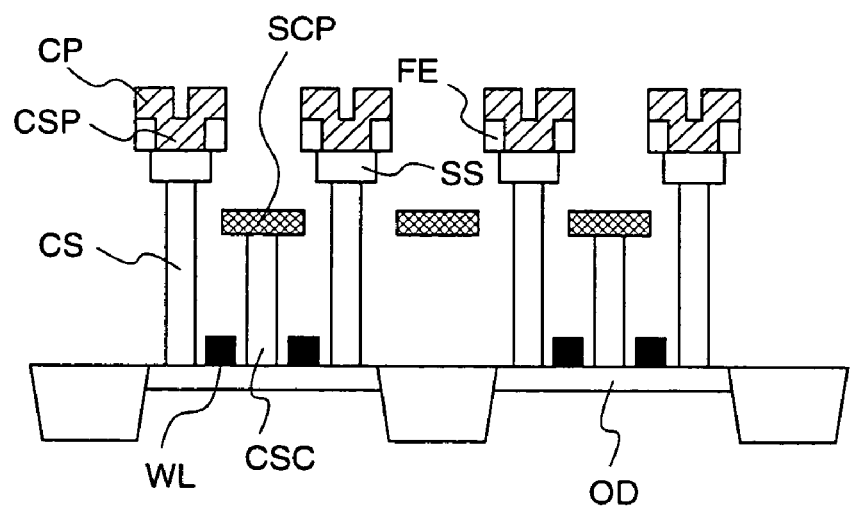
FIG. 14(c) is a cross-sectional view taken along a line A2-A2' in FIG. 14(a).
Figure 14D:
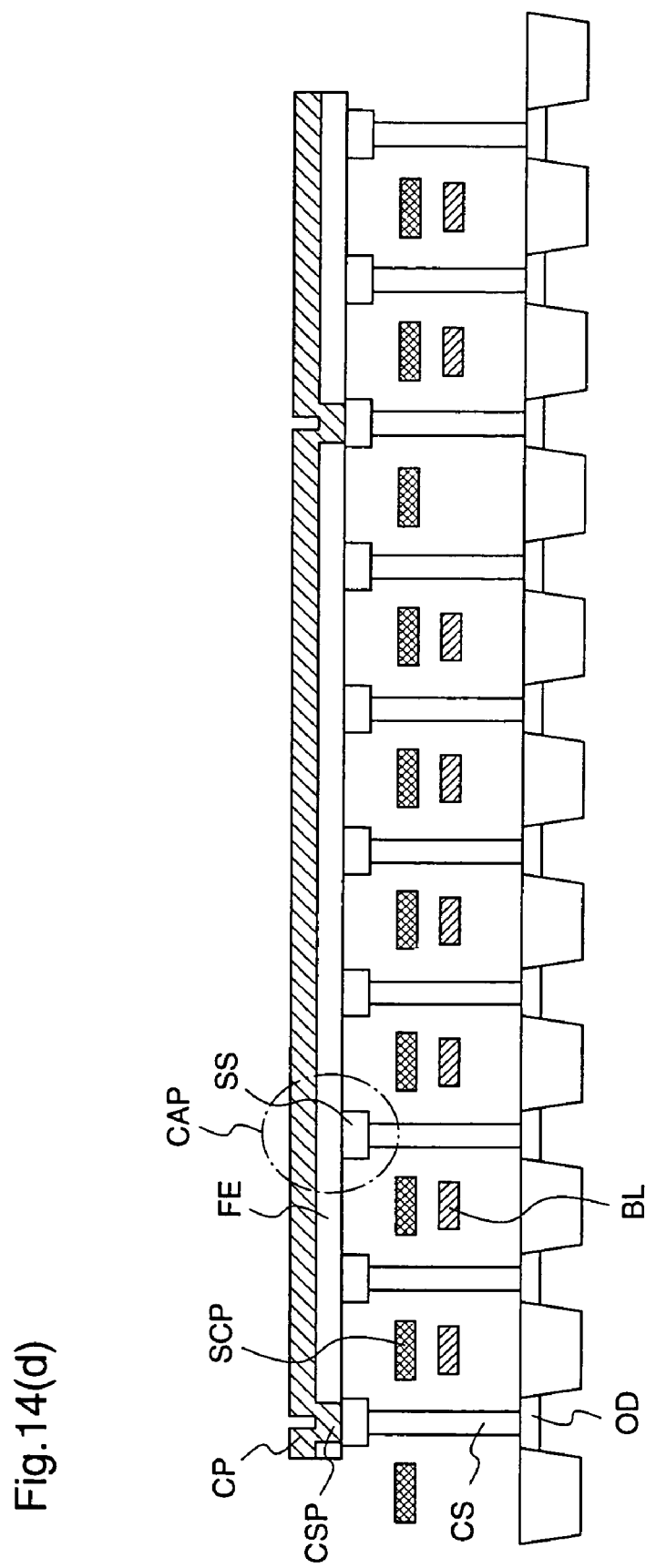
FIG. 14(d) is a cross-sectional view taken along a line B1-B1' in FIG. 14(a).
Figure 14E:
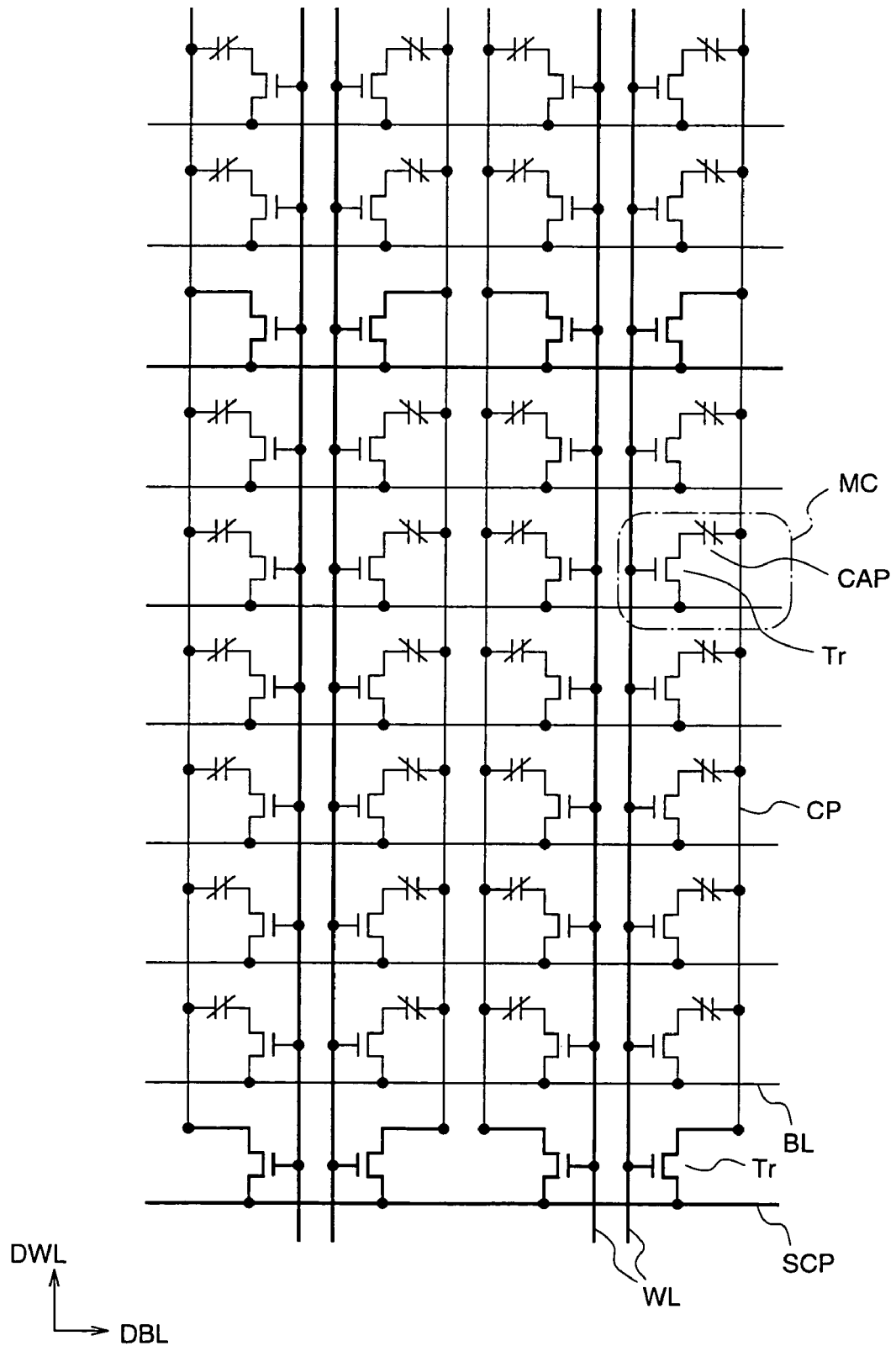
FIG. 14(e) is a circuit schematic view of the memory cell array shown in FIG. 14(a).

FIG. 14(a) is a plan view illustrating a memory cell array, FIG. 14(b) is a cross-sectional view taken along a line A1-A1' in FIG. 14(a), FIG. 14(c) is a cross-sectional view taken along a line A2-A2' in FIG. 14(a), and FIG. 14(d) is a cross-sectional view taken along a line B1-B1' in FIG. 14(a). FIG. 14(e) is a circuit schematic view of the memory cell array shown in FIG. 14(a).

While in the second embodiment the plate line voltage supply lines SCP and the bit lines BL are formed of the same layer that is positioned beneath the layer constituting the capacitors CAP, in the seventh embodiment the plate line voltage supply lines SCP and the bit lines BL are formed of different layers that are positioned beneath the layer constituting the capacitors CAP, as shown in FIGS. 14(a)~14(d).

In this seventh embodiment constructed as mentioned above, while the bit lines BL are connected to the diffused layers OD through the bit line contacts CB as in the second embodiment, the plate line voltage supply lines SCP that are positioned above the bit lines BL are, in contrast to the second embodiment, connected to the diffused layers OD by wiring contacts CSC other than the bit line contacts CB. In the example shown in FIG. 14, the plane pattern of the plate line voltage supply lines SCP is a lattice pattern.

In this seventh embodiment, since the plate line voltage supply lines SCP and the bit lines BL are formed of different layers positioned beneath the layer constituting the capacitors CAP, respectively, the wiring width of the plate line voltage supply lines SCP can be increased as compared with the case where these lines are formed of the same layer positioned beneath the layer constituting the capacitors CAP, whereby speed-up of data access to the memory cell can be achieved.

Embodiment 8

Figure 15:
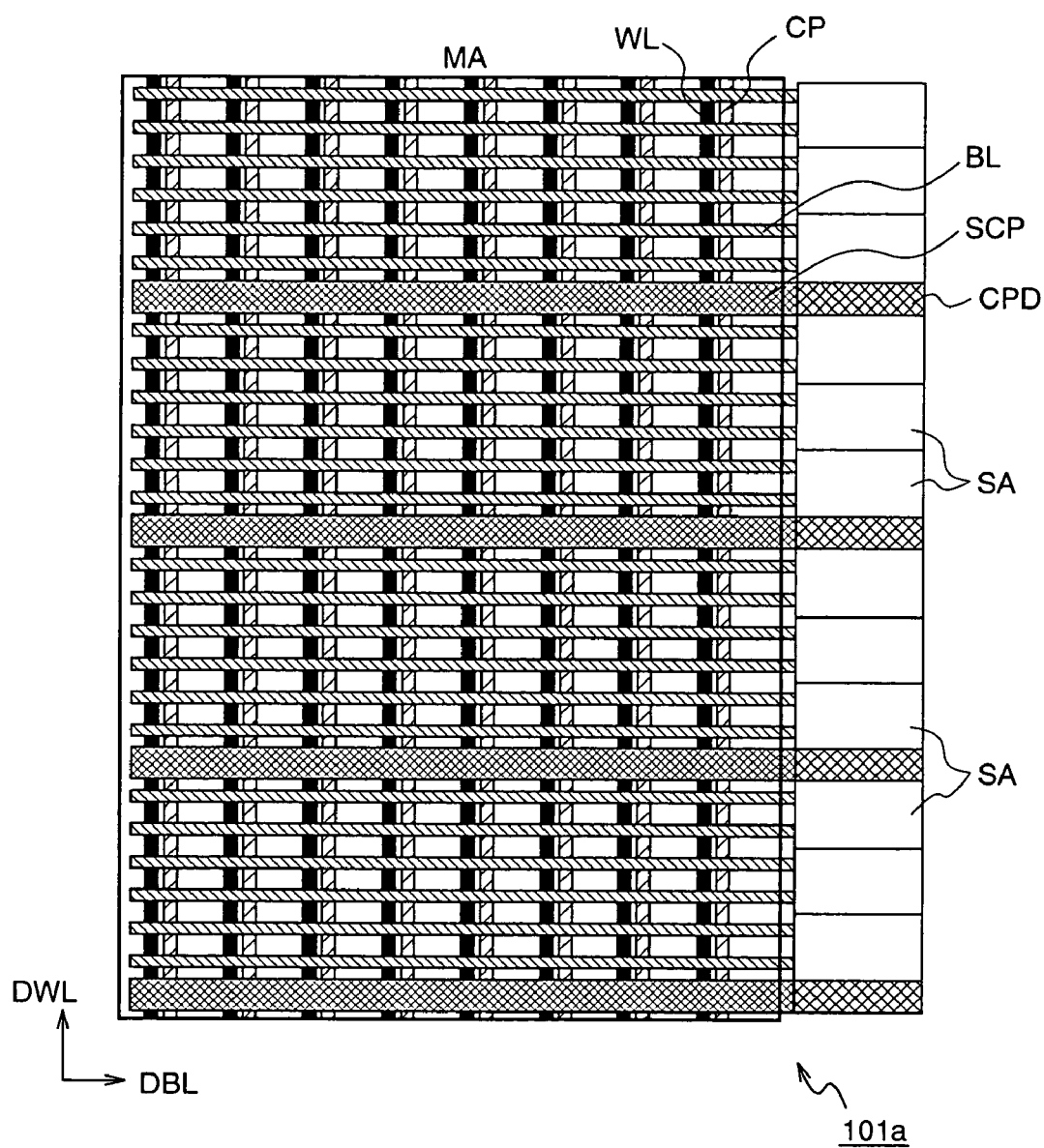
FIG. 15 is a plan view illustrating an example wherein the width of the plate line voltage supply line of the first embodiment is larger than the width of the bit line, in a semiconductor memory device according to an eighth embodiment of the present invention.

FIG. 15 is a diagram illustrating a semiconductor memory device according to an eighth embodiment of the present invention.

In the first to fifth embodiments, the plate line voltage supply lines SCP are formed of the same layer and in the same shape as the bit lines BL. In this eighth embodiment, however, the shape of the plate line voltage supply line SCP is different from that of the bit line BL, although the plate line voltage supply lines and the bit lines BL are formed of the same layer.

To be specific, in the semiconductor memory device 101a according to the eighth embodiment, as shown in FIG. 15, the plate line voltage supply lines SCP of the memory cell array MA are made thicker than the plate line voltage supply lines SCP according to the first embodiment.

In the eighth embodiment constituted as mentioned above, the resistance of the plate line voltage supply line SCP is reduced as compared with that of the first embodiment, thereby achieving further speed-up of the data access operation to the memory cells.

Embodiment 9

Figure 16:
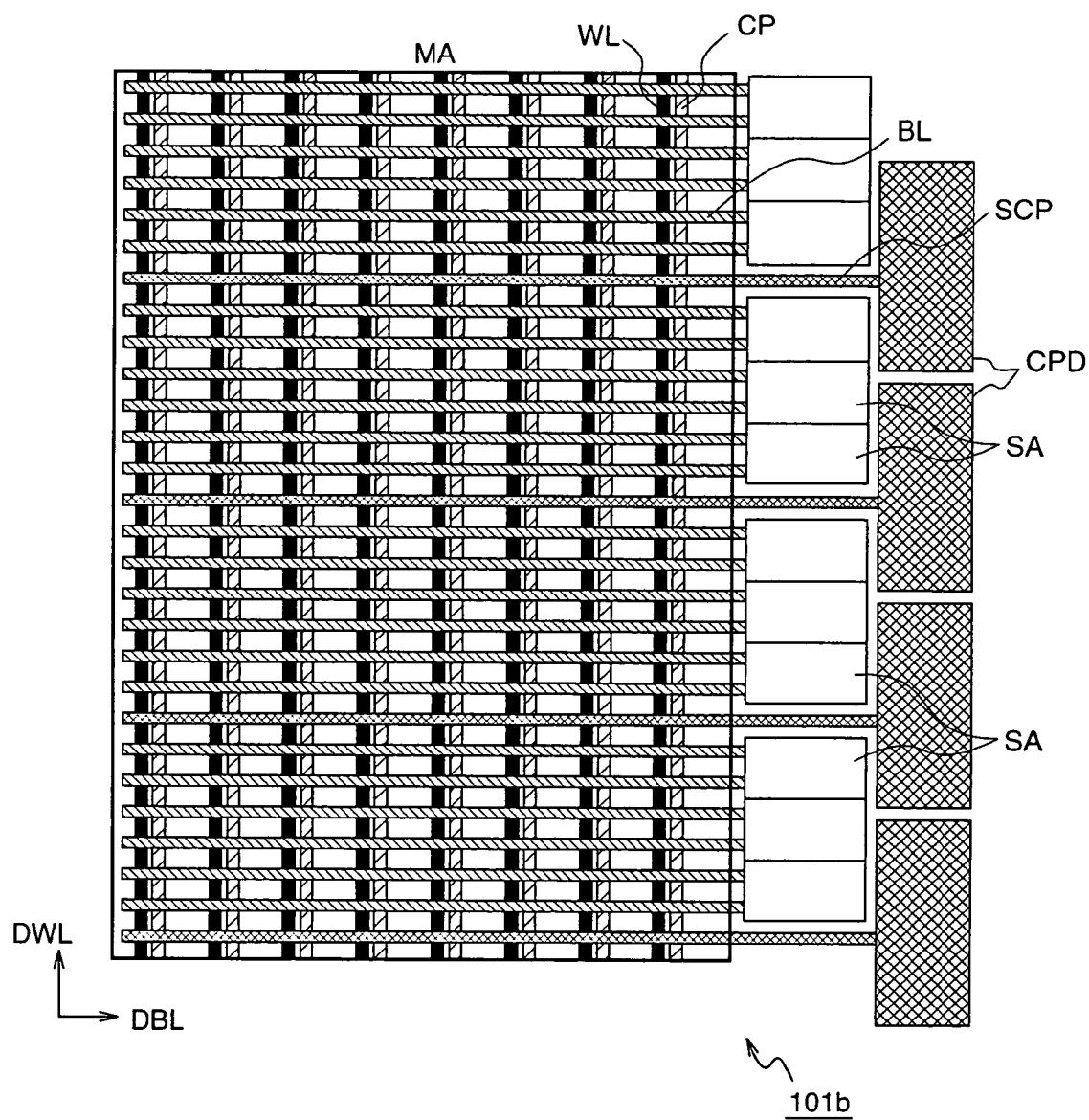
FIG. 16 is a plan view illustrating an example wherein the plate line voltage supply circuit of the first embodiment is disposed in a place other than a place between plural sense amplifier circuits arranged in the column direction.

FIG. 16 is a diagram illustrating a semiconductor memory device according to a ninth embodiment of the present invention.

In the semiconductor memory device 101b according to the ninth embodiment, plural plate line voltage supply circuits CDP are disposed in the column direction, outside lines in which plural sense amplifier circuits are disposed in the column direction, while in the first to eighth embodiments each of the plate line voltage supply circuits is disposed between two sense amplifier circuits in each predetermined position on the lines obtained in which plural sense amplifier circuits are disposed in the column direction.

In the semiconductor memory device according to the ninth embodiment, the degree of freedom in arrangement of the respective plate line voltage supply circuits CDP, whereby the layout design thereof is facilitated.

Embodiment 10

Figure 17A:
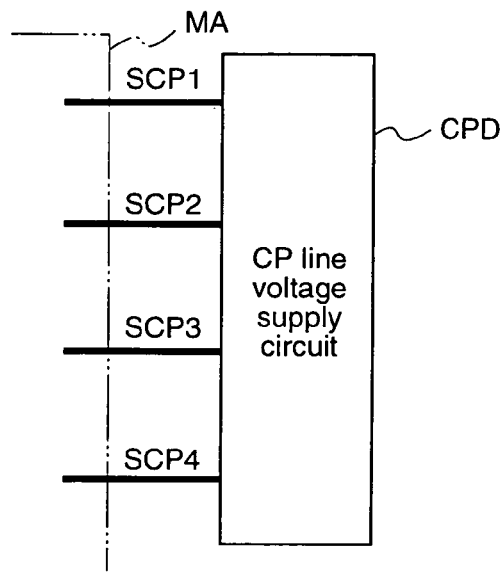
FIG. 17(a) is a diagram illustrating an example wherein four plate line voltage supply lines are connected to one plate line voltage supply circuit, in a semiconductor memory device according to a tenth embodiment of the present invention.
Figure 17B:
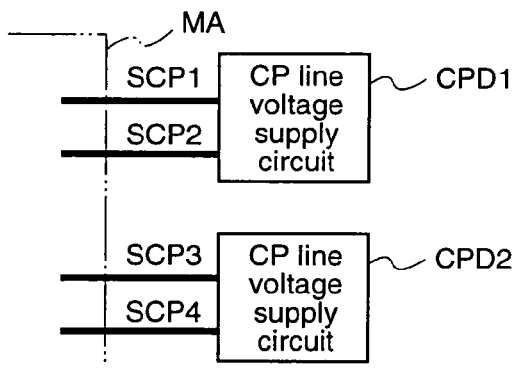
FIG. 17(b) is a diagram illustrating an example wherein two plate line voltage supply lines are connected to one plate line voltage supply circuit, in the semiconductor memory device according to the tenth embodiment of the present invention.

FIGS. 17(a) and 17(b) are diagrams illustrating a semiconductor memory device according to a tenth embodiment of the present invention.

Figure 17C:
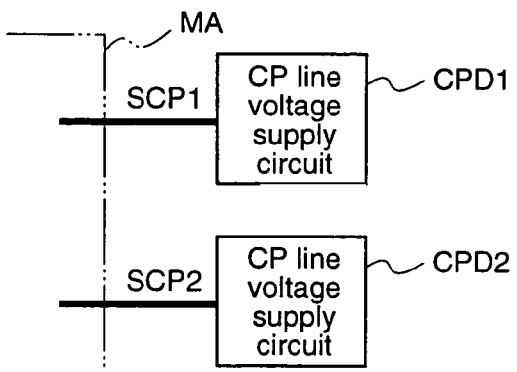
FIG. 17(c) is a diagram for illustrating connection between the plate line voltage supply circuit and the plate line voltage supply line.

In the first to ninth embodiments, only one plate line voltage supply line is connected to each plate line voltage supply circuit, for example, as shown in FIG. 17(c), the plate line voltage supply line SCP1 is connected to the plate line voltage supply circuit CPD1 and the plate line voltage supply line SCP2 is connected to the plate line voltage supply circuit CPD2. In the semiconductor memory device according to the tenth embodiment, however, plural plate line voltage supply lines SCP are connected to one plate line voltage supply circuit CPD. That is, four plate line voltage supply lines SCP1, SCP2, SCP3, and SCP4 are connected to one plate line voltage supply circuit CPD in the example shown in FIG. 17(a), and two plate line voltage supply lines SCP1 and SCP2 are connected to the plate line voltage supply circuit CPD1 while two plate line voltage supply lines SCP3 and SCP4 are connected to the plate line voltage supply circuit CPD2, respectively, in the example shown in FIG. 17(b).

In the tenth embodiment constituted as mentioned above, since plate line voltage is supplied from one plate line voltage supply circuit to plural plate line voltage supply lines, the same voltage can be supplied to the plural plate line voltage supply lines, whereby voltages of the plate line voltage supply lines and the plate lines can be stabilized. This connecting structure between the plate line voltage supply circuits and the plate line voltage supply lines can simplify the circuit design especially when it is used for the operation mode with the voltage of the plate line voltage supply lines being fixed, and further, reduction in the area of the circuit as well as stabilization of voltages at the plate line voltage supply lines and plate lines can be realized.

Embodiment 11

Figure 18A:
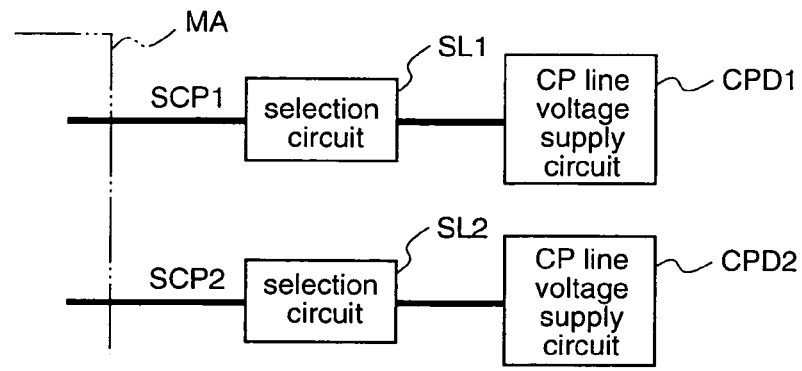
FIG. 18(a) is a diagram illustrating an example wherein the plate line voltage supply line of the first embodiment is connected to the plate line voltage supply circuit via a selection means, in a semiconductor memory device according to an eleventh embodiment of the present invention.
Figure 18B:
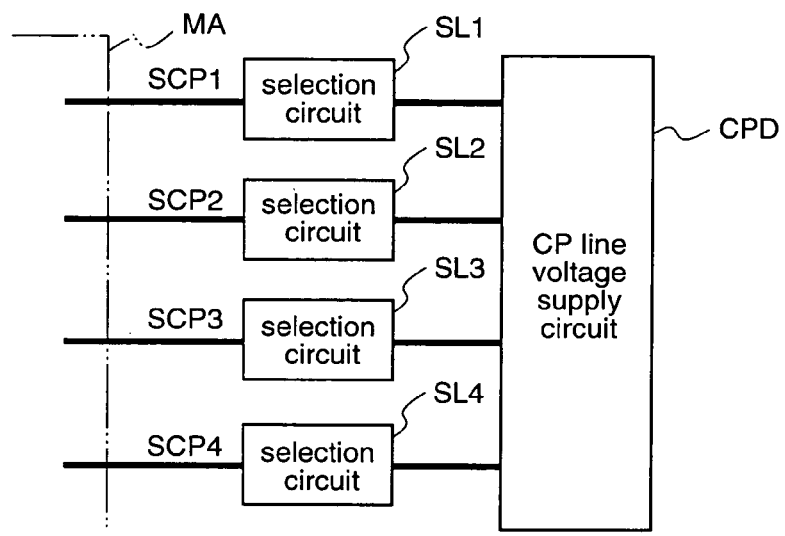
FIG. 18(b) is a diagram illustrating an example wherein four plate line voltage supply lines are connected to one plate line voltage supply circuit via a selection means.
Figure 18C:
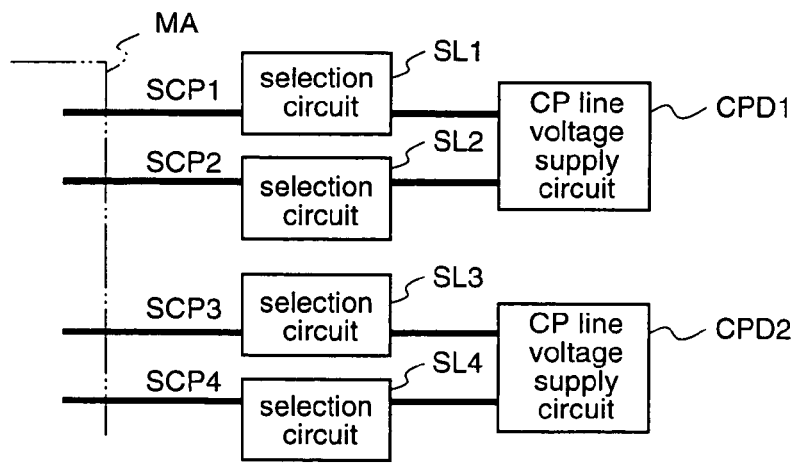
FIG. 18(c) is a diagram illustrating an example wherein two plate line voltage supply lines are connected to one plate line voltage supply circuit via a selection means.

FIGS. 18(a)~18(c) are diagrams illustrating a semiconductor memory device according to an eleventh embodiment of the present invention.

In the first to tenth embodiments, as shown in FIG. 17(c), the plate line voltage supply lines SCP are directly connected to the plate line voltage supply circuits by conductive members such as wirings or plugs, thereby to supply voltage to the plate lines. In the semiconductor memory device according to the eleventh embodiment, however, as shown in FIG. 18(a), 18(b), or 18(c), the plate line voltage supply lines SCP are connected to the plate line voltage supply circuits CPD through selection means (selection circuits).

As a specific circuit of this selection means, for example, a switch circuit is provided between the plate line voltage supply circuit CPD and the plate line voltage supply line SCP.

FIG. 18(a) shows an example in which plate line voltage supply lines SCP1 and SCP2 are connected to plate line voltage supply circuits CPD1 and CPD2 through selection circuits SL1 and SL2, respectively. In this example, driving of the plate line voltage supply lines can be carried out at high speed not by control of the plate line voltage supply circuits but by on/off control of the selection circuits as the above-mentioned selection means.

FIG. 18(b) shows an example in which four plate line voltage supply lines SCP (SCP1, SCP2, SCP3, and SCP4) are connected to one plate line voltage supply circuit CPD through selection circuits SL (SL1, SL2, SL3, and SL4), respectively.

FIG. 18(c) shows an example in which two plate line voltage supply lines SCP (SCP1 and SCP2) and two plate line voltage supply lines SCP (SCP3 and SCP4) are connected to a plate line voltage supply circuit CPD (CPD1) and to a plate line voltage supply circuit CPD (CPD2) through selection circuits SL (SL1 and SL2) and selection circuits (SL3 and SL4), respectively.

In the eleventh embodiment constituted as mentioned above, only the plate line voltage supply lines selected by the selection means from among the plural plate line voltage supply lines can be operated, thereby realizing operation with reduced power consumption.

Embodiment 12

Figure 19:
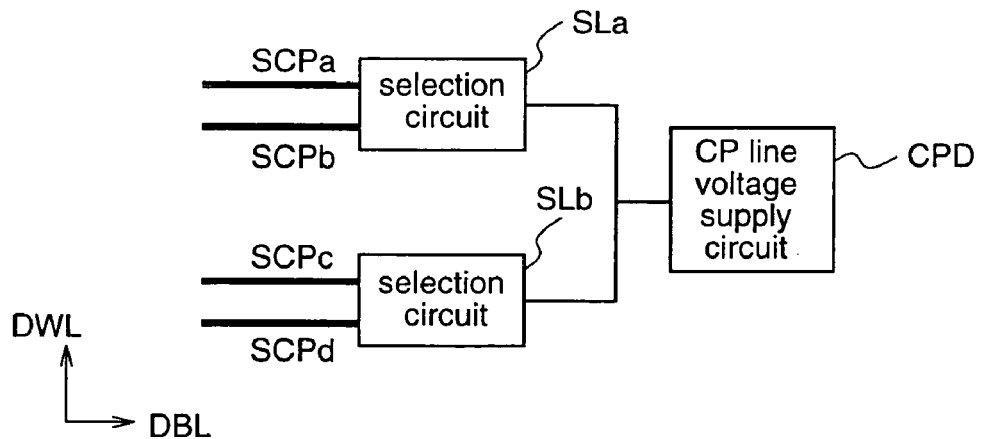
FIG. 19 is a diagram illustrating a modification of connection between the plate line voltage supply line and the selection means shown in FIG. 18(c), in a semiconductor memory device according to a twelfth embodiment of the present invention.

FIG. 19 is a diagram illustrating a semiconductor memory device according to a twelfth embodiment of the present invention.

In the eleventh embodiment shown in FIGS. 18(a) 18(c), each selection means connects one plate line voltage supply line to one plate line voltage supply circuit. In the semiconductor memory device according to the twelfth embodiment, however, each selection means selects one of plural plate line voltage supply lines, and the outputs from the respective selection means are connected to a common plate line voltage supply circuit.

To be specific, as shown in FIG. 19, in this twelfth embodiment, two selection circuits SL (SLa and SLb) are connected to one plate line voltage supply circuit CPD, and two plate line voltage supply lines SCPa and SCPb and two plate line voltage supply lines SCPc and SCPd are connected to the respective selection circuits.

In the twelfth embodiment constituted as described above, the plural plate line voltage supply lines can be selectively driven by the selection circuits, whereby power consumption can be reduced. Moreover, only one plate line voltage supply circuit is disposed in one memory cell array, whereby significant reduction in area can be realized depending on the construction of the selection circuit.

Embodiment 13

Figure 20A:
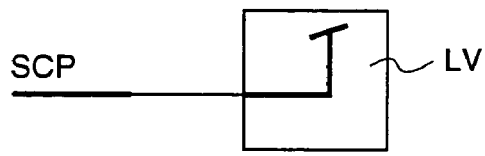
FIG. 20(a) is a diagram illustrating an example wherein a voltage is supplied from a power supply wiring to the plate line voltage supply line of the first embodiment, in a semiconductor memory device according to a thirteenth embodiment of the present invention.
Figure 20B:
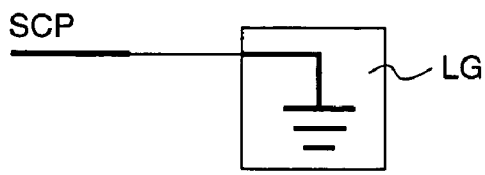
FIG. 20(b) is a diagram illustrating an example wherein a voltage of the plate line voltage supply line of the first embodiment is fixed to a ground power supply wiring, in the semiconductor memory device according to the thirteenth embodiment of the present invention.

FIGS. 20(a) and 20(b) are diagrams illustrating a semiconductor memory device according to a thirteenth embodiment of the present invention.

In the first to twelfth embodiments, the plate line voltage supply circuit drives the plate line voltage supply lines at a constant voltage when performing data access to the memory cells. In the semiconductor memory device according to the thirteenth embodiment, the plate line voltage supply circuit comprises a power supply wiring, and the voltage of the plate line voltage supply line is fixed to the power supply wiring.

For example, as shown in FIG. 20(a), the plate line voltage supply line SCP may be fixed to the power supply voltage by a plate line voltage supply circuit LV comprising a VDD power supply wiring. Alternatively, as shown in FIG. 20(b), the plate line voltage supply line SCP may be fixed to the ground voltage by a plate line voltage supply circuit LG comprising a GND power supply wiring.

In the semiconductor memory device according to the thirteenth embodiment, the circuit structure for supplying voltage to the plate lines is simplified and the space of the circuit is reduced, whereby the semiconductor memory device can be easily designed, and the capability of supplying voltage to the plate lines can be made sufficient.

Embodiment 14

Figure 21A:
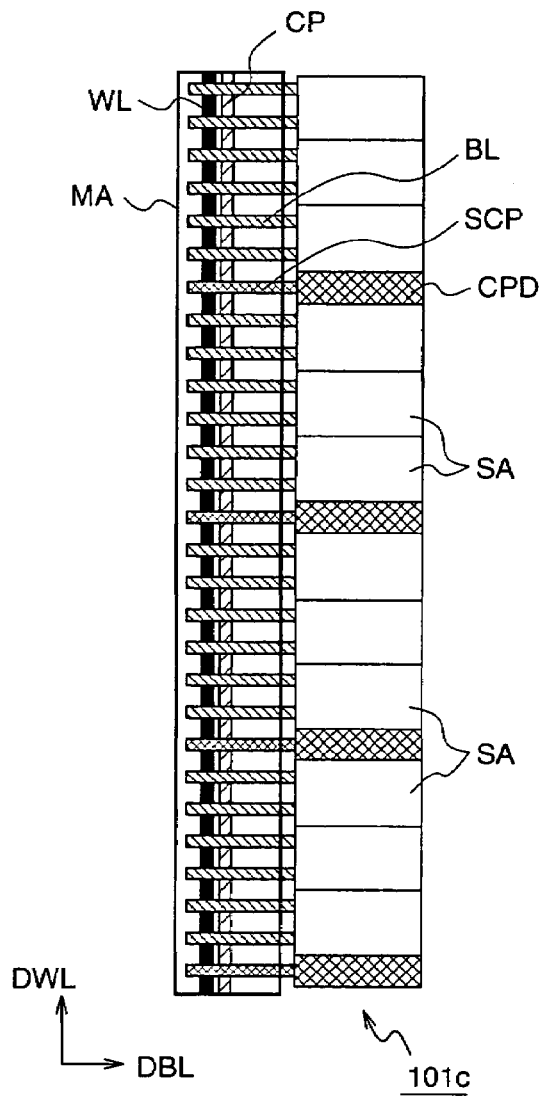
FIG. 21(a) is a plan view illustrating an example wherein arrangement of memory cells in the memory cell array of the first embodiment is restricted to only in the column direction, in a semiconductor memory device according to a fourteenth embodiment of the present invention.

FIG. 21(a) is a diagram illustrating a semiconductor memory device according to a fourteenth embodiment of the present invention.

In a semiconductor memory device 100c according to the fourteenth embodiment, only one line of a memory cell array is disposed in the column direction as shown in FIG. 21(a), while in the first to thirteenth embodiments the memory cell array comprises plural memory cells disposed in the row direction and the column direction.

That is, in this fourteenth embodiment, there are disposed plural bit lines BL and plural plate voltage supply lines SCP, which are extending in the row direction, and plural sense amplifier circuits SA extending in the column direction, and the respective sense amplifier circuits are electrically connected to the corresponding bit lines BL. Further, plural plate line voltage supply circuits CPD are disposed between two sense amplifier circuits SA in predetermined positions, on a line wherein the plural sense amplifier circuits SA are disposed in the column direction, and the respective plate line voltage supply circuits CPD are electrically connected to the corresponding plate voltage supply lines SCP. The word lines WL and the plate line CP, which extend in the column direction, are connected to the respective memory cells that are arranged in one line. Thereby, the plural plate voltage supply lines SCP are electrically connected to the one plate line CP at plural portions on the plate line CP.

In the semiconductor memory device 100c according to the fourteenth embodiment, the respective plate line voltage supply lines SCP extending in the row direction are electrically connected to the plate line at plural portions of the plate line CP extending in the column direction, and the plate line voltage is supplied from one plate line voltage supply circuit to each of the plural plate line voltage supply lines SCP, thereby achieving speed-up of the plate line driving.

Embodiment 15

Figure 21B:
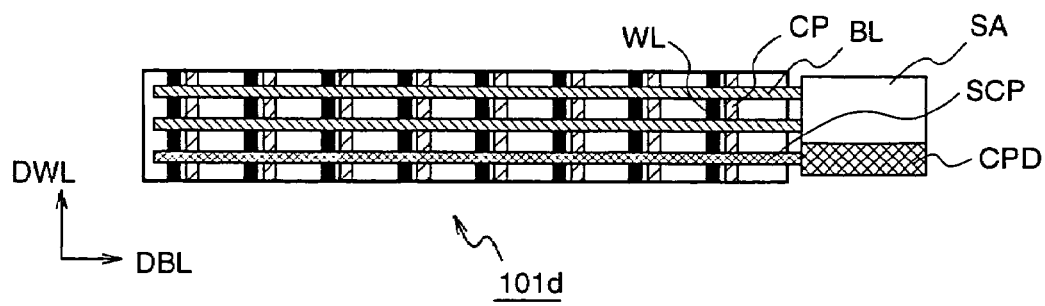
FIG. 21(b) is a plan view illustrating an example wherein arrangement of memory cells in the memory cell array of the first embodiment is restricted to only in the row direction, in a semiconductor memory device according to a fifteenth embodiment of the present invention.

FIG. 21(b) is a diagram illustrating a semiconductor memory device according to a fifteenth embodiment of the present invention.

In the semiconductor memory device 100d according to the fifteenth embodiment, only one line of a memory cell array is disposed in the row direction as shown in FIG. 21(b), while in the first to thirteenth embodiments the memory cell array comprises plural memory cells disposed in the row direction and the column direction.

That is, in this fifteenth embodiment, there are disposed plural word lines WL and plural plate lines CP, which are extending in the column direction, and one sense amplifier circuit SA is provided for plural memory cells and is electrically connected to the bit lines BL. One plate line voltage supply circuit CPD is provided for plural memory cells, and is electrically connected to one plate voltage supply line SCP. The bit lines BL and the plate voltage supply line SCP, which extend in the row direction, are connected to the respective memory cells that are arranged in one line in the row direction, and one plate voltage supply line SCP connected to the one plate line voltage supply circuit CPD is electrically connected to each of the plural plate lines CP.

In the semiconductor memory device 101d according to the fifteenth embodiment, there are disposed the plural plate lines CP extending in the column direction and the one plate line voltage supply line SCP extending in the row direction, and the one plate voltage supply line SCP is connected to each of the plural plate lines CP. Therefore, it is not necessary to provide the plate line voltage supply circuit CPD for each plate line, whereby the space of the plate line voltage supply circuit can be reduced, resulting in reduction in the area of the entire device.

APPLICABILITY IN INDUSTRY

The present invention provides a semiconductor memory device with a ferroelectric substance, which can realize high-speed operation, reduction in space, and low power consumption. Particularly, the above-mentioned effects can be achieved in a semiconductor memory device with a ferroelectric substance having plate lines.

What is claimed is:

1. A semiconductor memory device comprising:
   plural memory cells arranged in a matrix;
   plural bit lines and plural plate voltage supply lines extending in a row direction;
   plural word lines and plural plate lines extending in a column direction;
   plural sense amplifier circuits that are arranged in the column direction, and we electrically connected to the respective bit lines;
   plural plate line voltage supply circuits that are arranged in the column direction;
   means for electrically connecting each of the plural plate voltage supply lines with each of the plural plate lines; and
   means for electrically connecting each of the plural plate voltage supply lines with each of the plural plate line voltage supply circuits;
   wherein each of the plural bit lines is commonly connected to the plural memory cells arranged in the same row;
   each of the plural word lines and each of the plural plate lines are commonly connected to the plural memory cells arranged in the same column;
   each of the plural memory cells is electrically connected to the bit line through a selection transistor having a gate electrode connected to the word line, and has a capacitor electrically connected to the plate line; and
   the respective plate voltage supply lines are electrically connected to the plate lines at different positions on the same plate line.

2. A semiconductor memory device as defined in claim 1, wherein said capacitor is a ferroelectric capacitor or a high dielectric capacitor.

3. A semiconductor memory device as defined in claim 1, wherein the respective plate voltage supply lines are formed of the same layer as the bit lines.

4. A semiconductor memory device as defined in claim 1, wherein the respective plate voltage supply lines are formed of a layer different from that of the bit lines.

5. A semiconductor memory device as defined in claim 3, wherein the respective plate voltage supply lines are approximately equal in shape to the respective bit lines, or an interval between adjacent plate voltage supply line and bit line is approximately equal to an interval between adjacent two bit lines.

6. A semiconductor memory device as defined in claim 4, wherein the respective plate voltage supply lines are approximately equal in shape to the respective bit lines, or an interval between adjacent plate voltage supply line and bit line is approximately equal to an interval between adjacent two bit lines.

7. A semiconductor memory device as defined in claim 3, wherein the respective plate voltage supply lines are different in shape from the respective bit lines.

8. A semiconductor memory device as defined in claim 4, wherein the respective plate voltage supply lines are different in shape from the respective bit lines.

9. A semiconductor memory device as defined in claim 1, wherein said plural memory cells are divided into at least two memory cell groups in the column direction, and plural memory cells that arc arranged in the same column and belong to different memory cell groups are respectively connected to different plate lines.

10. A semiconductor memory device as defined in claim 1, wherein each of the plural plate line voltage supply circuits is selectively operated by means for selectively electrically connecting the plate line voltage supply circuit with each of the plate voltage supply lines.

11. A semiconductor memory device as defined in claim 1, wherein said means for electrically connecting each of the plural plate voltage supply lines with each of the plural plate lines is a selection circuit.

12. A semiconductor memory device as defined in claim 1, wherein said means for electrically connecting each of the plural plate voltage supply lines with each of the plural plate lines is a selection circuit including at least one transistor.

13. A semiconductor memory device as defined in claim 12, wherein at least one of the transistors included in the selection circuit has a gate connected to the word line.

14. A semiconductor memory device as defined in claim 12, wherein at least one of the transistors included in the selection circuit has a gate connected to a plate line driving signal line.

15. A semiconductor memory device as defined in claim 1, wherein, for each of said plate line voltage supply circuits, said plate line voltage supply circuit is disposed between two of the plural sense amplifier circuits arranged in the column direction.

16. A semiconductor memory device as defined in claim 1, wherein said means for electrically connecting each of the plate voltage supply lines with each of the plate lines is a conductive material, and the plate voltage supply line and the plate line are directly electrically connected.

17. A semiconductor memory device as defined in claim 1, wherein said plate line voltage supply circuits are power supply wirings.

18. A semiconductor memory device comprising:
plural memory cells;
a first bit line, a second bit line, and a plate voltage supply line extending in a row direction;
a word line and a plate line extending in a column direction;
a first sense amplifier circuit electrically connected to the first bit line;
a second sense amplifier circuit electrically connected to the second bit line; and
a plate line voltage supply circuit for supplying a plate line voltage to the plate voltage supply line;
wherein the plural memory cells are arranged in at least one of the row direction and the column direction;
the memory cells arranged in the same row are data-accessed by the same bit line;
the memory cells arranged in the same column are selected by the same word line, and are supplied with the plate line voltage through the same plate line;
the plate voltage supply line and the plate line are electrically connected at an intersection point thereof;
the plate line voltage supply circuit is a power supply wiring; and
the plate line voltage supply circuit is disposed between the first sense amplifier circuit and the second sense amplifier circuit in the column direction.

19. A semiconductor memory device as defined in claim 18, wherein said plate voltage supply line and said plate line are directly electrically connected with each other by a conductive material.

20. A semiconductor memory device comprising:
plural memory cells;
a bit line and a plate voltage supply line extending in a row direction;
a word line and a plate line extending in a column direction;
a sense amplifier circuit electrically connected to the bit line; and
a plate line voltage supply circuit for supplying a plate line voltage to the plate voltage supply line;
wherein the plural memory cells are arranged in at least one of the row direction and the column direction;
the memory cells arranged in the same column are selected by the same word line, and are supplied with the plate line voltage through the same plate line;
the plate voltage supply line and the plate line are electrically connected at an intersection point thereof;
said plural memory cells are arranged in only one line in the column direction,
plural bit lines and plural plate voltage supply lines extending in the row direction are disposed,
plural sense amplifier circuits are disposed in the column direction, and each sense amplifier circuit is electrically connected to a corresponding one of the bit lines,
plural plate line voltage supply circuits are disposed in the column direction, and each plate line voltage supply circuit is electrically connected to a corresponding one of the plate voltage supply lines,
said word line and said plate line extending in the column direction are commonly connected to the plural memory cells arranged in one column,
each of the plural memory cells is electrically connected to a corresponding one of the bit lines through a selection transistor having a gate electrode connected to the word line, and has a ferroelectric capacitor electrically connected to the plate line, and
said plural plate voltage supply lines are electrically connected to the plate line in at least one position on the same plate line.

21. A semiconductor memory device as defined in claim 20, wherein at least one of said plate voltage supply lines and said plate line are directly electrically connected with each other by a conductive member.

* * * * *

UNITED STATES PATENT AND TRADEMARK OFFICE
CERTIFICATE OF CORRECTION

| | | |
|---|---|---|
| PATENT NO. | : 7,388,769 B2 | |
| APPLICATION NO. | : 11/503956 | |
| DATED | : June 17, 2008 | |
| INVENTOR(S) | : Takashi Miki | |

It is certified that error appears in the above-identified patent and that said Letters Patent is hereby corrected as shown below:

Column 22

In line 2, "column direction, and we electronically connected to the" should read --column direction, and are electronically connected to the--.

Signed and Sealed this

Eleventh Day of November, 2008

JON W. DUDAS
*Director of the United States Patent and Trademark Office*